US012256621B2

(12) United States Patent
Kim et al.

(10) Patent No.: US 12,256,621 B2
(45) Date of Patent: Mar. 18, 2025

(54) DISPLAY PANEL AND ELECTRONIC DEVICE INCLUDING THE SAME

(71) Applicant: SAMSUNG ELECTRONICS CO., LTD., Suwon-si (KR)

(72) Inventors: Tae Gon Kim, Hwaseong-si (KR); Shin Ae Jun, Seongnam-si (KR); Deukseok Chung, Yongin-si (KR); Nayoun Won, Yongin-si (KR); Sung Hun Lee, Hwaseong-si (KR); Byoung Ki Choi, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 574 days.

(21) Appl. No.: 17/687,451

(22) Filed: Mar. 4, 2022

(65) Prior Publication Data
US 2022/0285446 A1 Sep. 8, 2022

(30) Foreign Application Priority Data

Mar. 5, 2021 (KR) .................. 10-2021-0029749

(51) Int. Cl.
H10K 59/38 (2023.01)
C09K 11/56 (2006.01)
(Continued)

(52) U.S. Cl.
CPC ............ H10K 59/38 (2023.02); C09K 11/565 (2013.01); C09K 11/883 (2013.01); H10K 59/12 (2023.02);
(Continued)

(58) Field of Classification Search
CPC .... H10K 59/38; H10K 59/12; H10K 59/1201; H10K 71/00; H10K 50/125; C09K 11/565; C09K 11/883; B82Y 20/00; B82Y 40/00
See application file for complete search history.

(56) References Cited

U.S. PATENT DOCUMENTS 10,240,087 B2  3/2019  Vick et al.
10,381,527 B2  8/2019  Vick et al.
(Continued)

FOREIGN PATENT DOCUMENTS

KR     20070008071 A   1/2007
KR     20160053974 A   5/2016
(Continued)

OTHER PUBLICATIONS

Kuo, Tsung-Rong, et al., Green Synthesis of InP/ZnS Core/Shell Quantum Dots for Application in Heavy-Metal-Free Light-Emitting Diodes, Nanoscale. Res. Lett., vol. 12, No. 537, 7 pages, 2017.
Yuanyuan Li, et al., A Novel QD-OLED Structure of High Optical Efficiency, ICDT 2019., vol. 50, Issue. S1, Session. 10, 3pp.

Primary Examiner — Michael M Trinh
(74) Attorney, Agent, or Firm — CANTOR COLBURN LLP

(57) ABSTRACT

A display panel including a light emitting panel; and a color conversion panel with a surface opposite a surface of the light emitting panel. The light emitting panel is configured to emit incident light including a first light and a second light. The color conversion panel includes a color conversion layer including two or more color conversion regions, a color conversion region includes a first region corresponding to the green pixel, the first region includes a matrix and a first composite dispersed within the matrix and including a plurality of luminescent nanostructures, and the spectral overlap between a UV-Vis absorption spectrum of the luminescent nanostructures, the maximum emission peak of the
(Continued)

first light, and the maximum emission peak of the second light satisfies the following equation:

$B/A \leq$ about 0.6

A and B are as defined.

20 Claims, 13 Drawing Sheets

(51) Int. Cl.
   *C09K 11/88* (2006.01)
   *H10K 59/12* (2023.01)
   *H10K 71/00* (2023.01)
   *B82Y 20/00* (2011.01)
   *B82Y 40/00* (2011.01)

(52) U.S. Cl.
   CPC .............. *H10K 71/00* (2023.02); *B82Y 20/00* (2013.01); *B82Y 40/00* (2013.01); *H10K 59/1201* (2023.02)

(56) References Cited

U.S. PATENT DOCUMENTS

| | | | |
|---|---|---|---|
| 10,401,550 B2 | 9/2019 | Kim et al. | |
| 10,833,228 B2 | 11/2020 | Vick et al. | |
| 12,078,827 B2* | 9/2024 | Park | C01B 19/007 |
| 2018/0239245 A1* | 8/2018 | Yang | C09D 4/00 |
| 2019/0072815 A1* | 3/2019 | Chung | G02F 1/133514 |
| 2019/0112523 A1* | 4/2019 | Kim | G02F 1/133617 |
| 2019/0211260 A1* | 7/2019 | Won | H10K 59/38 |
| 2020/0251040 A1 | 8/2020 | Lee et al. | |
| 2020/0399536 A1* | 12/2020 | Kim | C09K 11/025 |
| 2022/0285445 A1* | 9/2022 | Kim | C09K 11/0883 |

FOREIGN PATENT DOCUMENTS

| | | |
|---|---|---|
| KR | 20160094891 A | 8/2016 |
| KR | 20170096583 A | 8/2017 |
| KR | 20190000759 A | 1/2019 |
| WO | 10023603 A2 | 3/2010 |

\* cited by examiner

Pattern Preparation by using a photoresist

Repeating the Patterning Process three times

DISPLAY PANEL AND ELECTRONIC DEVICE INCLUDING THE SAME

CROSS-REFERENCE TO RELATED APPLICATION

This application claims priority to Korean Patent Application No. 10-2021-0029749 filed in the Korean Intellectual Property Office on Mar. 5, 2021, and all the benefits accruing therefrom under 35 U.S.C. § 119, the entire content of which is incorporated herein by reference.

BACKGROUND

1. Field

A display panel and an electronic device including the display panel are disclosed.

2. Description of the Related Art

Nanostructures may exhibit different aspects, characteristics, or properties from a corresponding bulk material having substantially the same composition, for example, in terms of physical properties (energy band gap, melting point, etc.), which are known as intrinsic properties of the bulk material. The luminescent nanostructure(s) may be configured to emit light by energy excitation (e.g., irradiation with light or application of a voltage). The luminescent nanostructure may find applicability in a variety of devices (e.g., display panels and electronic devices including the display panels).

SUMMARY

An embodiment provides a display panel including a color conversion panel including luminescent nanostructure(s).

An embodiment provides an electronic device including the display panel.

In an embodiment, a display panel includes a light emitting panel; and a color conversion panel with a surface opposite a surface of the light emitting panel (e.g., facing the light emitting panel), wherein the light emitting panel is configured to emit incident light including a first light with a maximum emission peak wavelength greater than or equal to about 450 nm and less than or equal to about 480 nm, and a second light with a maximum emission peak wavelength of greater than or equal to about 500 nm and less than or equal to about 580 nm, the color conversion panel includes a color conversion layer including a color conversion region (e.g., two or more color conversion regions), and optionally, a partition wall defining each region (or the color conversion regions) of the color conversion layer, the color conversion region includes a first region corresponding to a green pixel, the first region includes a first composite including a matrix and a plurality of luminescent nanostructures dispersed within the matrix, and the spectral overlap between a UV-Vis absorption spectrum of the luminescent nanostructures, the maximum emission peak of the first light, and the maximum emission peak of the second light satisfies the following equation:

$B/A \leq$ about 0.6.

Herein, A corresponds to an area where a UV-Vis absorption spectrum of the luminescent nanostructures overlaps with the maximum emission peak of the first light in a wavelength region of less than or equal to about 500 nm, and B corresponds to an area where a UV-Vis absorption spectrum of the luminescent nanostructures overlaps with the maximum emission peak of the second light in a wavelength region of greater than or equal to about 500 nm.

Herein, for determination of the A, a height of a first absorption peak of the UV-Vis absorption spectrum of the luminescent nanostructures and a height of the maximum emission peak of the first light are adjusted to be equal, and for determination of the B, a height of a first absorption peak of the UV-Vis absorption spectrum of the luminescent nanostructures and a height of the maximum emission peak of the second light are adjusted to be equal.

The plurality of luminescent nanostructures may be configured to convert the emission spectrum of the incident light.

The light emitting panel may include a first electrode and a second electrode, and a light emitting layer disposed between the first electrode and the second electrode.

The light emitting layer may include an organic compound and a dopant.

The light emitting layer may include a first light emitting layer(s) and a second light emitting layer(s) disposed on the first light emitting layer.

The first light emitting layer may be configured to emit the first light.

The second light emitting layer may be configured to emit the second light.

The light emitting layer may further include a first charge generation layer disposed between the first light emitting layer and the second light emitting layer.

The light emitting layer may further include a charge auxiliary layer disposed between the first electrode and the first light emitting layer, between the second electrode and the second light emitting layer, or between the first electrode and the first light emitting layer and between the second electrode and the second light emitting layer.

The charge auxiliary layer(s) may include a hole auxiliary layer, an electron auxiliary layer, or both.

The light emitting layer may include a second light emitting layer disposed between two or more first light emitting layers.

The light emitting layer may include a first light emitting layer disposed between two or more second light emitting layers.

The incident light may not include red light having a wavelength of greater than or equal to about 600 nm and less than or equal to about 680 nm.

The incident light may include green light and blue light.

The maximum emission peak (wavelength) of the second light may be in a range of greater than or equal to about 515 nm and less than or equal to about 530 nm. The maximum emission peak (wavelength) of the first light may be in a range of greater than about 440 nm, for example, greater than or equal to about 445 nm, or greater than or equal to about 450 nm, greater than or equal to about 455 nm and less than or equal to about 465 nm.

The maximum photoluminescence peak wavelength of the luminescent nanostructures may be in the range of greater than or equal to about 520 nm and less than or equal to about 550 nm.

A difference in the wavelength of the first absorption peak of the luminescent nanostructures and the wavelength of the maximum photoluminescence peak of the luminescent nanostructures may be greater than or equal to about 45 nm and less than or equal to about 65 nm.

The first composite may exhibit an incident light (e.g. blue light) absorbance of greater than or equal to about 89%, greater than or equal to about 89.5%, greater than or equal to about 90%, or greater than or equal to about 90.5%

The first composite may exhibit a light conversion rate that is greater than or equal to about 45%, greater than or equal to about 46%, greater than or equal to about 47%, or greater than or equal to about 48%.

In the UV-Vis absorption spectrum of the luminescent nanostructures, an absorbance ratio at a first absorption peak wavelength or a wavelength of about 450 nm with respect to a wavelength at about 350 nm (e.g., A450/A350) may be greater than or equal to about 0.078:1, greater than or equal to about 0.09:1, greater than or equal to about 0.1:1, greater than or equal to about 0.12:1, greater than or equal to about 0.2:1, greater than or equal to about 0.23:1, greater than or equal to about 0.234:1, greater than or equal to about 0.24:1 or greater than or equal to about 0.243:1.

The luminescent nanostructures may exhibit a UV-Vis absorption spectrum curve having a positive differential coefficient value at about 450 nm.

The differential coefficient value may be greater than or equal to about 0.0001.

The luminescent nanostructures may include a first semiconductor nanocrystal including a Group III-V compound and a second semiconductor nanocrystal including a zinc chalcogenide,
the Group III-V compound includes indium, phosphorus, and optionally zinc,
the zinc chalcogenide includes zinc, selenium, and sulfur, and
the luminescent nanostructures may not contain cadmium.

In the luminescent nanostructures, a mole ratio of sulfur to selenium (S:Se) may be greater than or equal to about 0.3:1, or greater than or equal to about 0.5:1. In the luminescent nanostructures, a mole ratio of sulfur to selenium may be greater than or equal to about 1.9:1, greater than or equal to about 2:1, greater than or equal to about 2.01:1, greater than or equal to about 2.1:1, greater than or equal to about 2.3:1, greater than or equal to about 2.4:1, greater than or equal to about 2.5:1, greater than or equal to about 2.6:1, greater than or equal to about 3:1, greater than or equal to about 3.5:1, or greater than or equal to about 4:1.

In the luminescent nanostructures, the mole ratio of sulfur to selenium may be less than or equal to about 15:1, less than or equal to about 14.5:1, less than or equal to about 14:1, less than or equal to about 13:1, less than or equal to about 12:1, less than or equal to about 11:1, less than or equal to about 10:1, less than or equal to about 8:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.8:1, less than or equal to about 2.7:1, less than or equal to about 2.67:1, or less than or equal to about 2.66:1.

In the luminescent nanostructures, a mole ratio of sulfur to indium may be greater than or equal to about 3:1, greater than or equal to about 5:1, greater than or equal to about 7:1, greater than or equal to about 9:1, or greater than or equal to about 9.4:1. In the luminescent nanostructures, the mole ratio of sulfur to indium may be less than or equal to about 20:1, less than or equal to about 17:1, less than or equal to about 15:1, less than or equal to about 13:1, less than or equal to about 12:1, or less than or equal to about 11.5:1.

In the luminescent nanostructures, a mole ratio of selenium to indium may be less than or equal to about 10:1, less than or equal to about 8:1, less than or equal to about 7:1, less than or equal to about 6:1, less than or equal to about 5:1, or less than or equal to about 4.8:1. The mole ratio of selenium to indium may be greater than or equal to about 1:1, greater than or equal to about 2:1, greater than or equal to about 2.5:1, greater than or equal to about 3:1, greater than or equal to about 3.5:1, greater than or equal to about 4:1, or greater than or equal to about 4.3:1.

In the luminescent nanostructures, a mole ratio of zinc to indium may be less than or equal to about 30:1, less than or equal to about 24:1, less than or equal to about 23:1, less than or equal to about 22:1, less than or equal to about 21:1, less than or equal to about 20:1, less than or equal to about 19:1, less than or equal to about 18:1, or less than or equal to about 17:1. The mole ratio of zinc to indium may be greater than or equal to about 5:1, greater than or equal to about 10:1, greater than or equal to about 15:1, or greater than or equal to about 17:1.

In the luminescent nanostructures, a mole ratio of phosphorus to indium may be greater than or equal to about 0.7:1, greater than or equal to about 0.75:1, greater than or equal to about 0.8:1, greater than or equal to about 0.85:1, greater than or equal to about 0.88:1, greater than or equal to about 0.89:1, greater than or equal to about 0.9:1, greater than or equal to about 0.93:1, or greater than or equal to about 0.95:1. In the luminescent nanostructures, the mole ratio of phosphorus to indium may be less than or equal to about 1.5:1, less than or equal to about 1.4:1, less than or equal to about 1.3:1, less than or equal to about 1.2:1, less than or equal to about 1.1:1, less than or equal to about 1.05:1, less than or equal to about 1:1, or less than or equal to about 0.95:1.

The luminescent nanostructures may have an average size of less than or equal to about 6 nm when confirmed by electron microscopy analysis. The luminescent nanostructures may have a size distribution of less than or equal to about 30% of the average size, as confirmed by electron microscopy analysis.

In the spectral overlap, the B/A may be less than or equal to about 0.5, or less than or equal to about 0.45.

The first composite or the color conversion panel may have an incident light absorbance defined by the following equation of greater than or equal to about 89%:

$$\text{Incident light absorbance (\%)} = [(B-B')/B] \times 100$$

B: light dose of (blue) incident light (for example, having a wavelength of less than or equal to about 500 nm)
B': light dose of (blue) incident light (for example, having a wavelength of less than or equal to about 500 nm) that has passed through the first composite.

The first composite or the color conversion panel may have a light conversion rate defined by the following equation of greater than or equal to about 45%:

$$A/B\ (\%) = \text{light conversion rate}$$

A: light dose of green light (for example, having a wavelength of greater than about 500 nm) emitted from the first composite
B: light dose of (blue) incident light (having a wavelength of less than or equal to about 500 nm).

The first composite may have the form of a patterned film.

The color conversion region may further include a second region corresponding to a red pixel, a third region corresponding to a blue pixel, or a combination thereof.

In an embodiment, the electronic device (or display device) includes the color conversion panel or the display panel.

A display panel according to an embodiment may exhibit enhanced optical properties, thereby providing an image of improved quality. The display panel of an embodiment may be applied to various electronic devices, such as a TV, a monitor, a mobile device, VR/AR, an electric vehicle display, and the like.

BRIEF DESCRIPTION OF THE DRAWINGS

In FIG. 7A, "QD-B_OLED" is for the spectral overlap A (a.u., arbitrary unit) and "QD-G_OLED" is for the spectral overlap B.

DETAILED DESCRIPTION

Figure 1A:
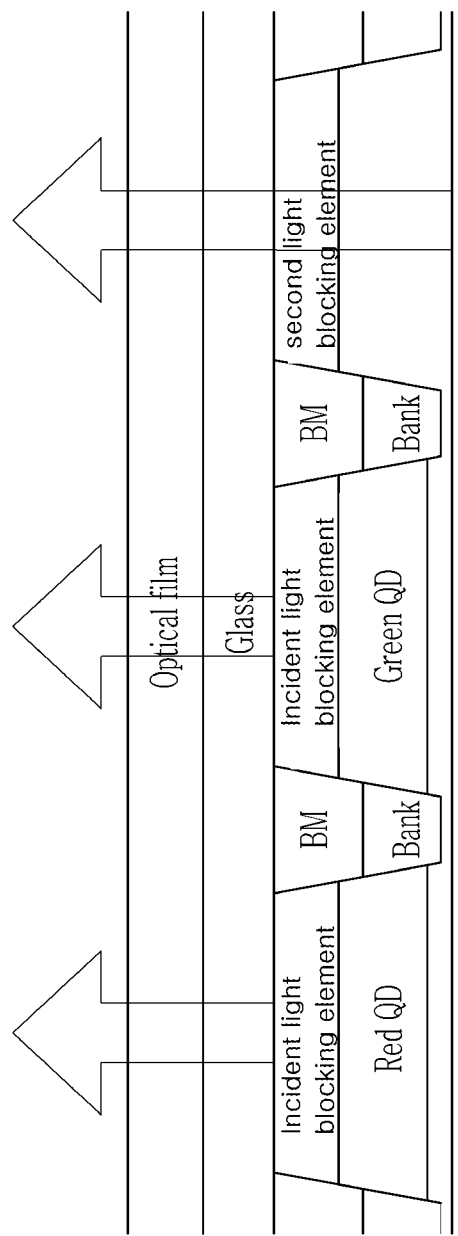
FIG. 1A is a schematic cross-sectional view of a color conversion panel included in a display panel according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise.

Herein, the description that does not contain cadmium (or other toxic heavy metals) means that the concentration of cadmium (or the corresponding heavy metal) is less than or equal to about 100 ppm (by weight), less than or equal to about 50 ppm, less than or equal to about 10 ppm, less than or equal to about 1 ppm, less than or equal to about 0.1 ppm, less than or equal to about 0.01 ppm, or nearly about 0. In an embodiment, substantially no cadmium (or its heavy metal) is present, or, if present, cadmium is present in an amount or impurity level below the detection limit of a given detection means.

Hereinafter, as used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR) (wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

In addition, when a definition is not otherwise provided below, "hetero" refers to a compound, group, or substituent including 1 to 3 heteroatoms selected from N, O, S, Si, or P.

As used herein, "alkylene group" refers to a linear or branched saturated aliphatic hydrocarbon group that optionally includes at least one substituent and has two or more valences.

As used herein, "arylene group" refers to a functional group that optionally includes at least one substituent, and having two or more valences formed by removal of at least two hydrogens in at least one aromatic ring.

In addition, "aliphatic hydrocarbon group" refers to a C1 to C30 linear or branched alkyl group, a C2 to C30 linear or branched alkenyl group, or a C2 to C30 linear or branched alkynyl group, "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, and a C3 to C30 cycloalkynyl group.

As used herein, the term "(meth)acrylate" refers to acrylate and/or methacrylate.

As used herein, "Group" refers to a Group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and TI, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

Hereinafter, the term "combination" may include a mixed and/or two or more stacked structures.

Herein, the nanostructure refers to at least one region having a nanoscale dimension or a structure having a characteristic dimension. In an embodiment, the dimensions of the nanostructures may be less than about 300 nm, less than about 250 nm, less than about 150 nm, less than about 100 nm, less than about 50 nm, or less than about 30 nm. These structures may have any shape. The nanostructures may have any shape, such as nanowires, nanorods, nanotubes, multi-pod type shapes having two or more pods, nanodots (or quantum dots), and are not particularly limited. The nanostructures may be, for example, substantially crystalline, substantially monocrystalline, polycrystalline, amorphous, or a combination thereof.

Quantum dots herein refer to (e.g., semiconductor-based) nanocrystals that exhibit quantum confinement or exciton confinement, and are a type of luminescent nanostructures (e.g., capable of emitting light by energy excitation). Herein, the shape of the "quantum dot" is not limited unless otherwise defined.

Herein, the term "dispersion" refers to a dispersion in which a dispersed phase is a solid, and a continuous medium includes a liquid or a solid different from the dispersed phase. Herein, the "dispersion" may be a colloidal dispersion in which the dispersed phase has a dimension of greater than or equal to about 1 nm, for example, greater than or equal to about 2 nm, greater than or equal to about 3 nm, or greater than or equal to about 4 nm and several micrometers (um) or less, (e.g., less than or equal to about 2 um, less than or equal to about 1 um, less than or equal to about 900 nm, less than or equal to about 800 nm, less than or equal to about 700 nm, less than or equal to about 600 nm, or less than or equal to about 500 nm.

Herein, the mean may be median or mean. In an embodiment, the average may be mean.

Herein, quantum efficiency may be easily and reproducibly determined using commercially available equipment (e.g., from Hitachi Co., Ltd or Otsuka Co, Ltd, etc.) and referring to manuals provided by, for example, respective equipment manufacturers. Quantum efficiency (or quantum yield) may be measured either in solution or in the solid state (in a composite). In an embodiment, quantum efficiency (or quantum yield) is the ratio of photons emitted to photons absorbed by the nanostructure or population thereof. In an embodiment, quantum efficiency may be measured by any method. For example, for fluorescence quantum yield or efficiency, there may be two methods: an absolute method and a relative method. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto.

The full width at half maximum and the maximum PL peak wavelength may be measured, for example, by a photoluminescence spectrum obtained by a spectrophotometer such as a fluorescence spectrophotometer or the like.

Herein, the "first absorption peak wavelength" refers to the wavelength of the first main peak appearing in the lowest energy region in the UV-Vis absorption spectrum.

Luminescent nanostructures may be included in a variety of electronic devices. The electrical and/or optical properties of the nanostructures may vary depending on their physical properties (e.g., composition, size, and/or shape). For example, the luminescent nanostructures may be semiconductor nanocrystal particles. The luminescent nanostructures (e.g., quantum dots) have a large surface area per unit volume, and thus, may exhibit a quantum confinement effect, and exhibit different physical or optical properties from a corresponding bulk material having the same composition. For example, the luminescent nanostructures, such as quantum dots, may absorb energy (e.g., light) from an excitation source, become energetically excited, and release energy corresponding to their bandgap energy.

The luminescent nanostructures may be applied to a color conversion panel (e.g., a luminescent-type color filter) in the form of a composite (e.g., a polymer composite) patterned to correspond to a pixel or a display panel including the composite. For example, in contrast to a liquid crystal display that includes a white light emitting backlight and an absorption-type color filter, in a display panel that includes a quantum dot-based color conversion panel or luminescent type color filter, a light emitting material layer may be disposed relatively in front of the panel device, and the light emitting material layer may convert incident light supplied from a light source (or a light emitting panel) respectively into light of a desired emission spectrum (e.g., red light or green light). As a result, such a display panel may exhibit a wide viewing angle due to forward scattering of light emitted from the light emitting material, and therefore, may solve or address an issue of light loss due to the use of an absorption-type color filter.

The luminescent nanostructure-based color filter or color conversion panel may be used with various light sources, however, a loss in luminous efficiency of a given light source, and/or a relatively low light conversion rate of incident light in such a device may be important technical hurdles one will likely need to address in the development of a device with a color conversion panel. For example, when an organic electroluminescent device is used as a light source, luminous efficiency of the electroluminescent device and a light conversion rate of incident light emitted therefrom may have an influence on display quality of a display panel. Still, luminescent nanostructures disposed in a color conversion region or a composite including the luminescent nanostructures (e.g., micro LED, an electroluminescent device, or the like) remains of interest and is a subject of active research with respect to achieving efficient absorption of incident light emitted from a given light source. For example, to improve upon absorbance, the composite may include a separate optical scatter and/or have an increased thickness. In addition, incident light absorbance by the luminescent nanostructures themselves that are present in the composite may be also an important technical issue to be addressed.

In addition, luminescent nanostructures that achieve a desired absorbance of incident light or luminescence properties generally include harmful heavy metals such as cadmium, lead, or the like. However, since the cadmium and the lead pose serious environmental/health problems and belong to regulated elements, relatively eco-friendly luminescent nanostructures are needed to advance development of next-generation display devices. Accordingly, there has been in-depth research on Group III-V compound-based semiconductor nanocrystals that achieve similar or even greater optical properties than the more harmful materials, however, this remains a significant and on-going technical challenge. As confirmed by the present inventors, the Group III-V compound (e.g., indium phosphide)-based cadmium-free luminescent nanostructures have relatively insufficient optical properties (e.g., luminous efficiency and/or incident light absorbance), compared with the luminescent nanostructures that include the harmful heavy metals. Accordingly, it is desirable to develop a display realizing improved optical properties without including harmful heavy metals such as cadmium, lead, and the like.

This display panel according to an embodiment may include a light emitting panel emitting incident light of mixed color (e.g., including a first light and a second light) to improve overall properties of a device. The light emitting panel may provide the necessary increase in luminous efficiency and/or improvement of life-span characteristics of the device. The light emitting panel may have, for example, a tandem structure in which a plurality of light emitting layers are stacked.

Without wishing to be bound by any theory, incident light may directly affect efficiency of the corresponding display panel, for example, blue light (emitted from an organic electroluminescent device) may be a fluorescent-type light having a low intrinsic efficiency. The light emitting panel in the display panel according to an embodiment may emit a mix of green light and blue light (e.g., by adopting the tandem structure in which a green phosphor layer is disposed between two blue emitting layers), and thereby, increase overall efficiency of the device.

In addition to the light emitting panel that emits incident light of mixed color, the display panel according to an embodiment may also include a color conversion panel including the luminescent nanostructures having controlled optical properties (e.g., a UV-Vis absorption curve and a ratio of absorbances at two or more predetermined wavelengths). This color conversion panel, when used with the light emitting panel, may exhibit improved optical properties (e.g., an incident light absorbance, a light conversion rate, and the like). For example, a green pixel in the display panel of an embodiment may be configured to extract green incident light with increased efficiency. In a display panel of an embodiment, because an absorption spectrum of the luminescent nanostructures disposed in the green pixel is restricted by spectral overlapping with a maximum emission peak of the incident light (e.g., blue and green incident light), the incident light is minimized from unnecessary color conversion, and green light at a desired wavelength may be emitted.

Figure 2:
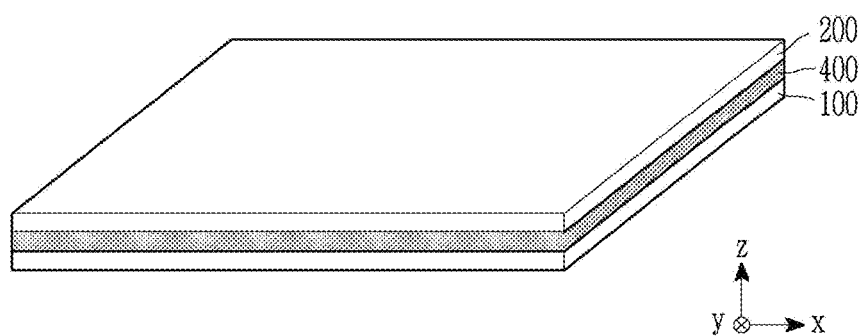
FIG. 2 is a perspective view illustrating an example of a display panel including a color conversion panel according to an embodiment.
Figure 3:
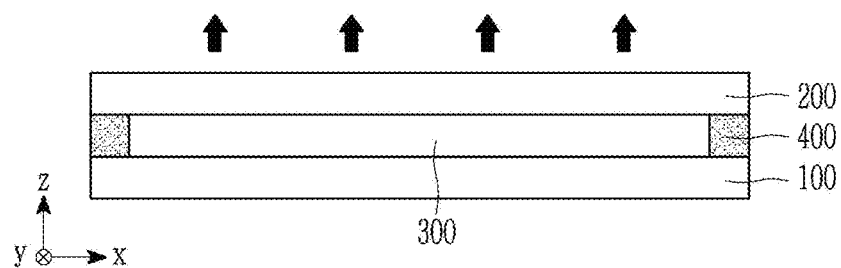
FIG. 3 is a cross-sectional view of the display panel of FIG. 2.

Hereinafter, a display panel according to an embodiment is described with reference to the drawings. Referring to FIGS. 2 and 3, a display panel 1000 according to an embodiment includes a light emitting panel 100; and a color conversion panel 200 with a surface opposite a surface of the light emitting panel (e.g., facing the light emitting panel). The display panel 1000 according to an embodiment may further include light transmitting layer 300 disposed between the light emitting panel 100 and the color conversion panel 200, a binder or a binding element 400 for adhering the light emitting panel 100 to the color conversion panel 200, or a combination thereof.

In an embodiment, the light emitting panel 100 and the color conversion panel 200 may face each other with the light transmitting layer 300 therebetween, and the color conversion panel 200 may be positioned such that light emitted from the light emitting panel 100 is directed toward the color conversion panel 200. The binder or the blinding element 400 may be disposed along the edges of the light emitting panel 100 and the color conversion panel 200, and may be, for example, a sealant.

Figure 4:
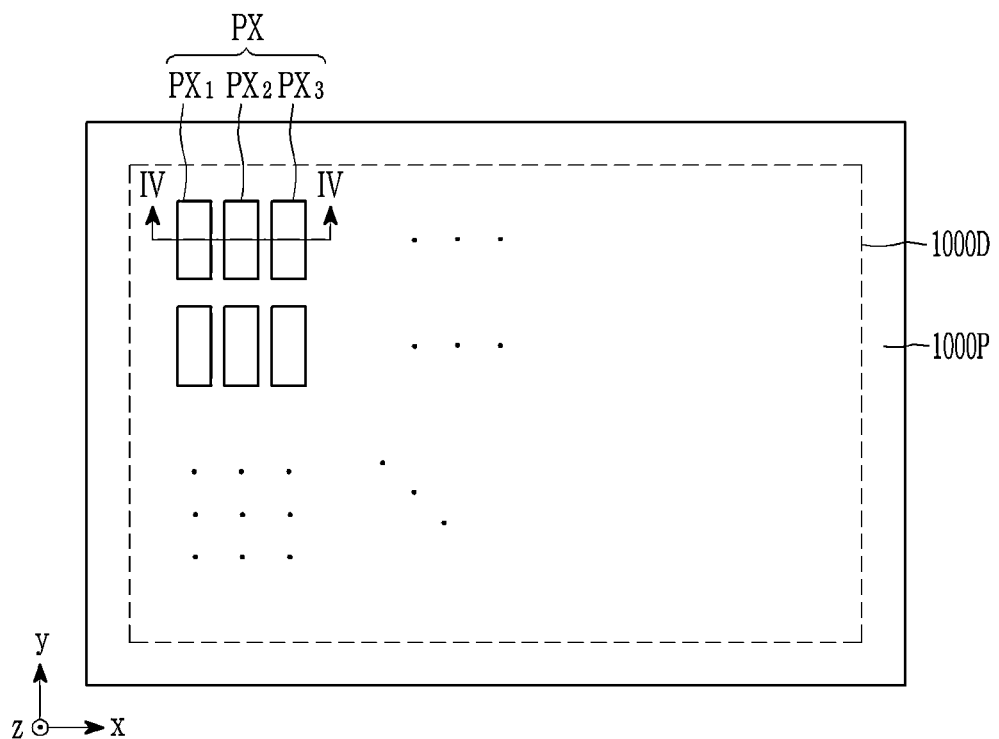
FIG. 4 is a plan view illustrating an example of a pixel arrangement of a display panel (e.g., of FIG. 2).

Referring to FIG. 4, a display panel 1000 according to an embodiment includes a display area 1000D for displaying an image and a non-display area 1000P disposed around the display area 1000D and in which the binding element 400 may be located.

The display area 1000D may include a plurality of pixels PXs arranged along a row (e.g., x direction) and/or a column (e.g., y direction), and each pixel PX may include a plurality of sub-pixels $PX_1$, $PX_2$, and $PX_3$ displaying different colors. Herein, as an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PenTile matrix, and/or a diamond matrix, but is not limited thereto.

Each of the sub-pixels $PX_1$, $PX_2$, and $PX_3$ may be configured to display a color of three primary colors or a combination of three primary colors, for example, red, green, blue, or a combination thereof (e.g., white light). For example, the first sub-pixel $PX_1$ may be configured to display red, the second sub-pixel $PX_2$ may be configured to display green, and the third sub-pixel $PX_3$ may be configured to display blue.

In the drawing, an example in which all sub-pixels have the same size is illustrated, but the present disclosure is not limited thereto. At least one of the sub-pixels may be larger or smaller than the other sub-pixels. In the drawing, an example in which all sub-pixels have the same shape is illustrated, but the present disclosure is not limited thereto. At least one of the sub-pixels may have a different shape from other sub-pixels.

In the display panel according to an embodiment, the light emitting panel 100 emits incident light (e.g., incident light of mixed colors) including a first light (e.g., blue light) and a second light (e.g., green light), for example, without emitting red light having a wavelength of greater than or equal to about 600 nm and less than or equal to about 680 nm to provide a light emitting panel with improved luminous efficiency.

The maximum emission peak wavelength of the first light may be in a range of greater than or equal to about 440 nm, greater than or equal to about 445 nm, greater than or equal to about 450 nm, for example, greater than or equal to about 455 nm, or greater than or equal to about 460 nm. The maximum emission peak wavelength of the first light may be in a range of less than or equal to about 480 nm, for example, less than or equal to about 475 nm, less than or equal to about 470 nm, or less than or equal to about 465 nm. The maximum emission peak wavelength of the second light may be in a range of greater than or equal to about 500 nm, greater than or equal to about 505 nm, greater than or equal to about 510 nm, or greater than or equal to about 515 nm. The maximum emission peak wavelength of the second light may be in a range of less than or equal to about 580 nm, less than or equal to about 575 nm, less than or equal to about 570 nm, less than or equal to about 565 nm, less than or equal to about 560 nm, less than or equal to about 550 nm, less than or equal to about 540 nm, less than or equal to about 535 nm, or less than or equal to about 530 nm.

Hereinafter, a display panel including the light emitting panel 100 and the color conversion panel 200 is described in more detail with reference to FIGS. 1, 5A, and 5B.

Figure 5A:
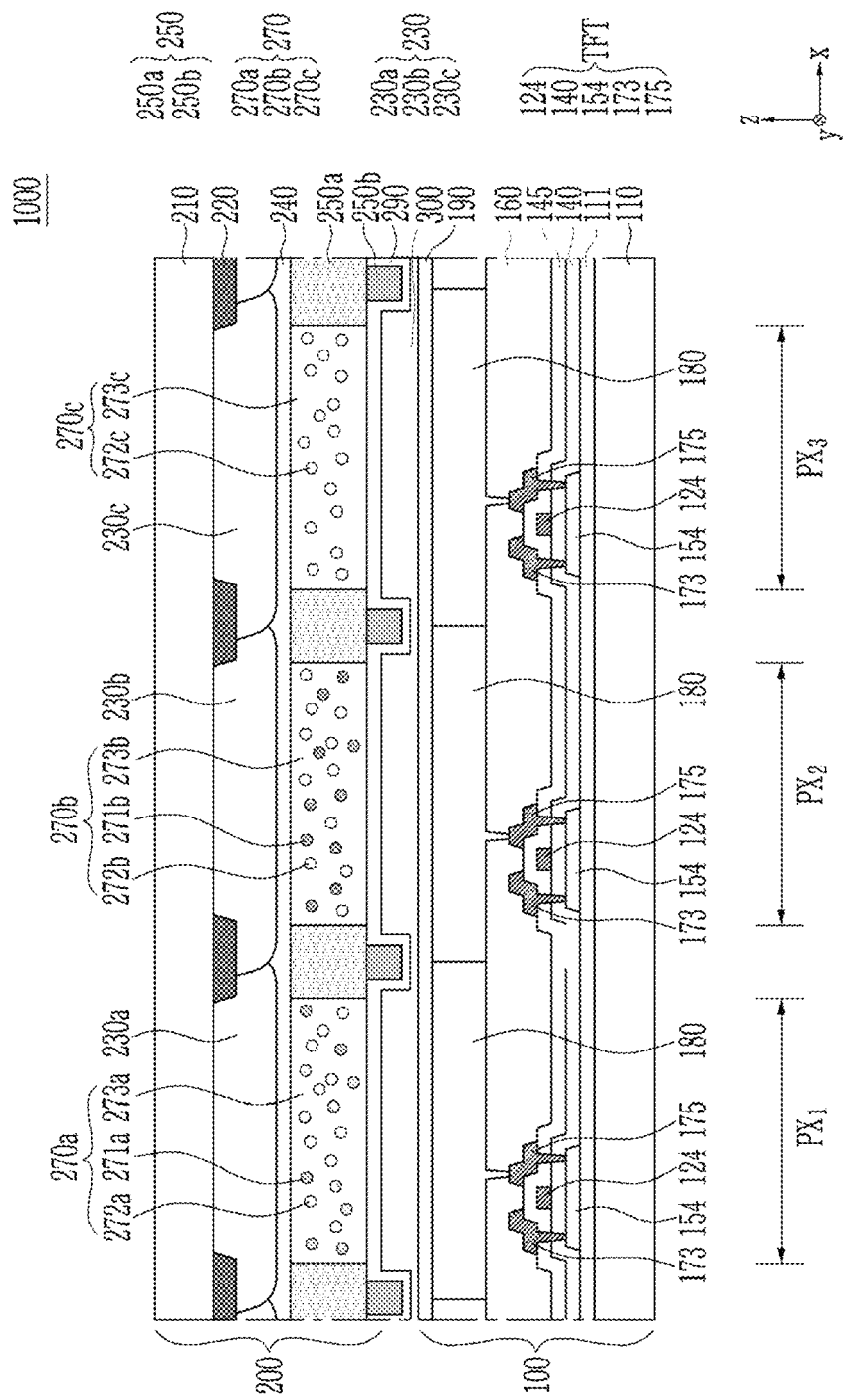
FIG. 5A is a schematic cross-sectional view of the display panel of FIG. 4 taken along line IV-IV.

Referring to FIG. 5A, the light emitting panel 100 may include a light emitting element configured to emit light of predetermined wavelength region (spectrum), and a circuit element for switching and/or driving the light emitting element. Referring to FIG. 5A, the light emitting panel 100 of an embodiment may include a lower substrate 110, a buffer layer 111, a thin film transistor TFT, a light emitting element 180, and optionally an encapsulation layer 190.

The lower substrate 110 may be an inorganic material substrate (e.g. a glass substrate) or an organic material substrate (e.g., a polymer substrate). In an embodiment, the lower substrate may be a polymer substrate. The polymer substrate may include, for example, polyimide, polyamide, poly(amide-imide), polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers, and may cover a portion of or the entire surface of the lower substrate 110. The buffer layer 111 may be omitted.

The thin film transistor TFT may be a three terminal element for switching and/or driving the light emitting element 180, which will be described later, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to the semiconductor layer 154. In the drawings, a coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an example in which the gate insulating layer 140 is formed on the entire surface of the lower substrate 110 is illustrated, but the present disclosure is not limited thereto and may be selectively formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting element 180 to be described later.

An interlayer insulating layer 145 is additionally formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor TFT. The protective layer 160 may be, for example, a passivation layer. The protective layer 160 may include an organic material, an inorganic material, or an organic-inorganic material, for example, polyacrylic, polyimide, polyamide, poly(amide-imide), or a combination thereof, but is not limited thereto. The protective layer 160 may be formed of one or two or three or more layers.

In the light emitting panel of an embodiment, the light emitting element 180 may be disposed for each sub-pixel $PX_1$, $PX_2$, and $PX_3$. The light emitting element 180 disposed in each sub-pixel $PX_1$, $PX_2$, and $PX_3$ may be independently driven. The light emitting element 180 may be, for example, a light emitting diode. The light emitting element 180 may be an electroluminescent element. The light emitting element 180 may be a micro LED. The light emitting element 180 may include a pair of electrodes and a light emitting layer between the pair of electrodes.

The light emitting layer may include a light emitting body emitting light in a predetermined wavelength region, for example may include a light emitting body emitting light of a first emission spectrum belonging to a visible wavelength spectrum. The light emitting body may include an organic light emitting body, an inorganic light emitting body, an organic-inorganic light emitting body, or a combination thereof, and may be one type or two or more types.

The light emitting element 180 may be, for example, an organic light emitting diode (OLED), an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

Figure 5B:
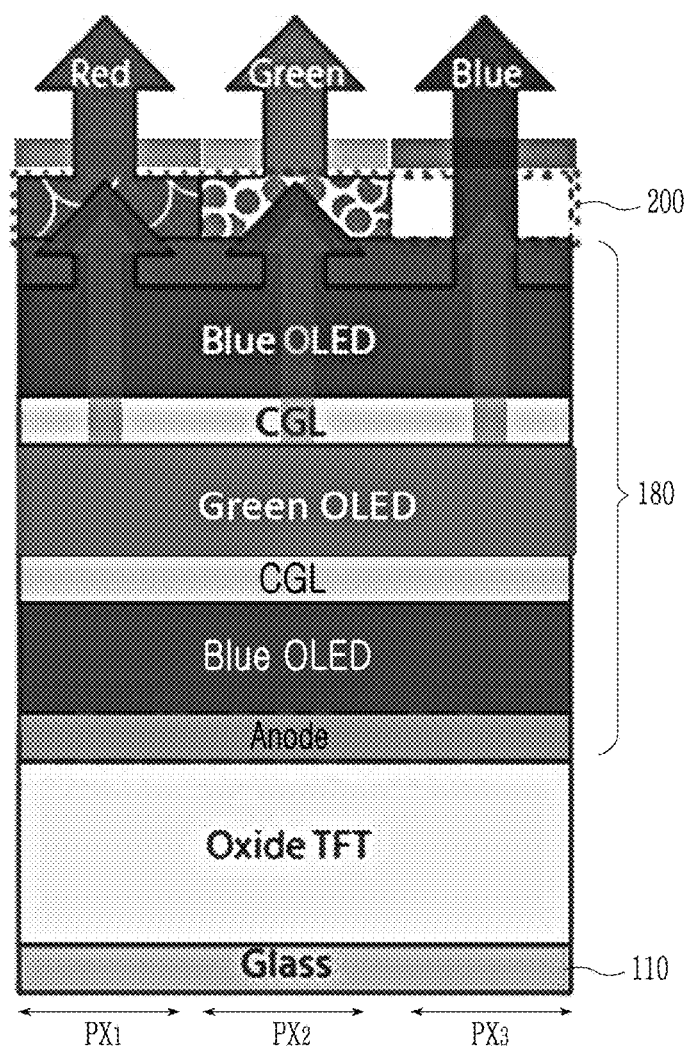
FIG. 5B is a cross-sectional view illustrating a light emitting element in more detail in a display panel according to an embodiment.

Referring to FIG. 5B schematically showing a display panel according to an embodiment, in the light emitting panel, an oxide-based TFT is disposed on a substrate, and a light emitting element having a tandem structure is disposed on the TFT. The light emitting element may include a blue light emitting layer, a green light emitting layer, and another blue light emitting layer disposed between the first electrode and the second electrode facing each other. Moreover, a charge generation layer CGL may be disposed between each of the light emitting layers. Although the first electrode and the second electrode are illustrated in a non-patterned form in FIG. 5B, the electrodes may be respectively patterned into a plurality of electrode elements to correspond to pixels. The first electrode may be an anode or a cathode. The second electrode may be a cathode or an anode.

Figure 6A:
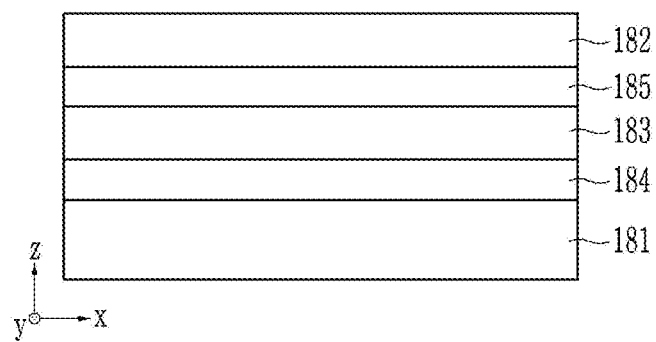
FIGS. 6A, 6B, 6C, and 6D are cross-sectional views illustrating examples of light emitting elements, respectively.
Figure 6B:
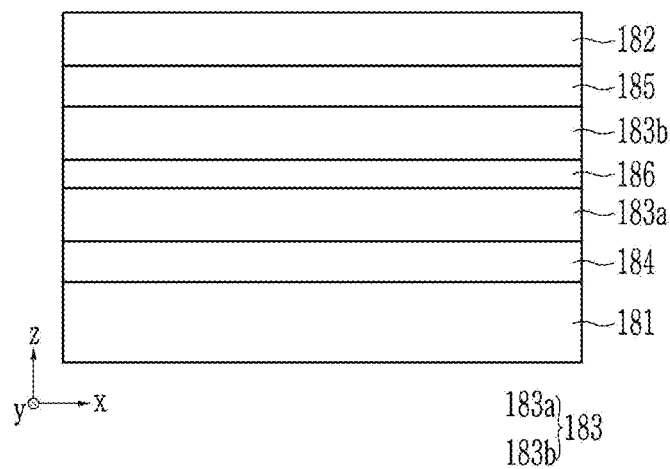
Figure 6C:
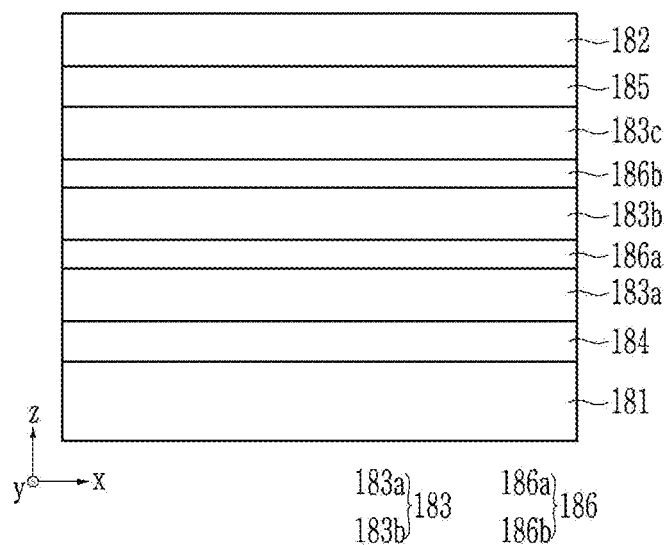
Figure 6D:
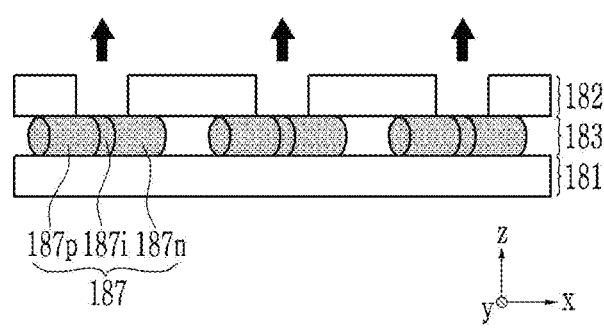

FIGS. 6A to 6C are cross-sectional views showing examples of light emitting elements.

Referring to FIG. 6A, in an embodiment, the light emitting element 180 may include a first electrode 181 and a second electrode 182 facing each other; a light emitting layer 183 disposed between the first electrode 181 and the second electrode 182; and optionally auxiliary layers 184 and 185 between the first electrode 181 and the light emitting layer 183 and between the second electrode 182 and the light emitting layer 183, respectively.

The first electrode 181 and the second electrode 182 each may have a surface opposite the other (i.e., disposed to face each other along a thickness direction, for example, z direction), and any one of the first electrode 181 and the second electrode 182 may be an anode and the other may be a cathode. The first electrode 181 may be a light transmitting electrode, a translucent electrode, or a reflecting electrode, and the second electrode 182 may be a light transmitting electrode, a transflective electrode. The light transmitting electrode or translucent electrode may be, for example, made of a monolayer or multiple layers of a metal thin film, including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflecting electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a first light emitting body capable of emitting light of a first emission spectrum and a second light emitting body capable of emitting light of a second emission spectrum. The first emission spectrum may be a blue emission spectrum. The second emission spectrum may be a green emission spectrum.

The maximum emission wavelength of the blue emission spectrum may belong to a wavelength region of greater than or equal to about 400 nm and less than about 500 nm, and within the range, may belong to a wavelength region of about 410 nm to about 490 nm, about 420 nm to about 480 nm, about 430 nm to about 470 nm, about 440 nm to about 465 nm, about 445 nm to about 460 nm, about 450 nm to about 458 nm, or any one range derived from the stated wavelengths. Light of the blue emission spectrum may have a maximum emission peak wavelength in the aforementioned range. In an embodiment, the light of the blue emission spectrum may have a maximum emission peak wavelength in a wavelength region of greater than or equal to about 400 nm and less than about 500 nm, about 410 nm to about 490 nm, about 420 nm to about 480 nm, about 430 nm to about 475 nm, about 440 nm to about 460 nm, about 445 nm to about 458 nm, about 450 nm to about 455 nm, or any one range derived from the stated wavelengths.

A maximum emission wavelength of the green emission spectrum may belong to a wavelength region of greater than or equal to about 500 nm and less than about 590 nm, within the range, about 510 nm to about 580 nm, about 515 nm to about 570 nm, about 520 nm to about 560 nm, about 525 nm to about 555 nm, about 530 nm to about 550 nm, about 535 nm to about 545 nm, or any one range derived from the stated wavelengths.

Light of the green emission spectrum may have a maximum emission peak wavelength in the aforementioned range. In an embodiment, the light of the green emission spectrum may have a maximum emission peak wavelength in a wavelength region of greater than or equal to about 500 nm and less than or equal to about 580 nm, about 510 nm to about 570 nm, about 515 nm to about 565 nm, about 520 nm to about 560 nm, about 525 nm to about 550 nm, about 530 nm to about 545 nm, about 535 nm to about 540 nm, or any one range derived from the stated wavelengths.

The first light emitting body (e.g., a blue light emitting material) may be a single material or compound or a mixture of at least two materials or compounds. The second light emitting body (e.g., green light emitting material) may be a single material or compound or a mixture of at least two materials or compounds.

For example, the light emitting layer 183, the first light emitting body, the second light emitting body, or a combination thereof (hereinafter, referred to as the light emitting layer) may include a host compound(s) (e.g., electron transporting or hole transporting compounds) and a dopant compound(s).

For example, the light emitting layer 183 may include a phosphorescent material, a fluorescent material, or a combination thereof. The first light emitting body may include a fluorescent material, a phosphorescent material, or a combination thereof. The second light emitting body may include a phosphorescent material, a fluorescent material, or a combination thereof. For example, the light emitting body may include an organic light emitting body, and the organic light emitting body may be a low molecular weight compound, a polymer compound, or a combination thereof. Specific types of the phosphorescent material and the fluorescent material are not particularly limited and may be appropriately selected from known materials.

The first light emitting body and/or second light emitting body may include a phosphorescent dopant. The dopant may be an organometallic compound including the metal M. The metal M may include iridium (Ir), platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), rhodium (Rh), palladium (Pd), silver (Ag), gold (Au), or a combination thereof.

In an embodiment, the phosphorescent dopant may include an organometallic compound containing iridium (Ir), an organometallic compound containing platinum (Pt), or an organometallic compound containing osmium (Os). In an embodiment, the dopant may include an organometallic compound having a square-planar coordination structure including the metal M (e.g., as described above). The dopant may include a substituted or unsubstituted C5 to C30 carbocyclic group, a substituted or unsubstituted C1 to C30 heterocyclic group, a non-cyclic group, or a combination thereof. The C5 to C30 carbocyclic group or the C1 to C30 heterocyclic group may be selected from a 6-membered ring, a condensed ring in which two or more 6-membered rings are condensed with each other, and a condensed ring in which one or more 6-membered rings are condensed with one or more 5-membered ring. The 6-membered ring may include a cyclohexane group, a cyclohexene group, an adamantane group, a norbornane group, a norbornene group, a benzene group, a pyridine group, a pyrimidine group, a pyrazine group, a pyridazine group, a triazine group, or a combination thereof. The 5-membered ring may include a cyclopentane group, a cyclopentene group, a cyclopentadiene group, a furan group, a thiophene group, a silol group, a pyrrole group, a pyrazole group, an imidazole group, a triazole group, an oxazole group, an isoxazole group, a thiazole group, an isothiazole group, an oxadiazole group, a thiadiazole group, or a combination thereof.

The dopant may include a metal M (e.g., described above) and an organic ligand, wherein the metal M and the organic ligand may form one, two or three cyclometallated rings. The dopant may include a metal M and a tetracoordinate organic ligand capable of forming three or four (e.g., three) cyclometallated rings. The tetracoordinate organic ligand may include, for example, a benzimidazole group, a benzene group, a pyridine group, an imidazole group, or a combination thereof, but is not limited thereto. The organic ligand may include selective substitution of one or more hydrogens with deuterium. When the light emitting body includes an organic light emitting body, the light emitting element 180 may be an organic light emitting diode.

For example, the light emitting body may include an inorganic light emitting body, and the inorganic light emitting body may be an inorganic semiconductor, quantum dots, perovskite, or a combination thereof. The inorganic semiconductor may include a metal nitride, a metal oxide, or a combination thereof. The metal nitride, metal oxide, or a combination thereof may include a Group III metal such as aluminum, gallium, indium, and thallium, a Group IV metal such as silicon, germanium, or tin, or a combination thereof. When the light emitting body includes an inorganic light emitting body, the light emitting element 180 may be a quantum dot light emitting diode, a perovskite light emitting diode, or a micro light emitting diode (micro-LED). Materials usable as the inorganic light emitting body are known.

In an embodiment, the light emitting element 180 may further include auxiliary layers 184 and 185. The auxiliary layers 184 and 185 may be disposed between the first electrode 181 and the light emitting layer 183, or disposed between the second electrode 182 and the light emitting layer 183, respectively. The auxiliary layers 184 and 185 may be a charge auxiliary layer to control injection and/or mobility of charge carriers (electron or holes). Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. At least one of the auxiliary layers 184 and 185 may be omitted. The material for each auxiliary layer may be appropriately selected from known materials for organic electroluminescent elements and the like.

The light emitting elements 180 disposed in each of the sub-pixels $PX_1$, $PX_2$, and $PX_3$ may be the same or different from each other. The light emitting elements 180 disposed in each of the sub-pixels $PX_1$, $PX_2$, and $PX_3$ may emit light having the same or different emission spectra. The light emitting elements 180 disposed in each of the sub-pixels $PX_1$, $PX_2$, and $PX_3$ may emit, for example, light having a blue emission spectrum, light having a green emission spectrum, or a combination thereof. The light emitting elements 180 disposed in each of the sub-pixels $PX_1$, $PX_2$, and $PX_3$ may be separated by a pixel defining layer.

In an embodiment, the light emitting element 180 may be a light emitting element having a tandem (or stacked) structure. In an embodiment, the light emitting element or the light emitting layer included therein may include a first light emitting layer and a second light emitting layer disposed on the first light emitting layer. The first light emitting layer may emit the first light and the second light emitting layer may emit the second light. A first charge generation layer may be disposed between the first light emitting layer and the second light emitting layer. Optionally, a charge auxiliary layer may be disposed between the first electrode and the first light emitting layer, a charge auxiliary layer may be disposed between the second electrode and the second light emitting layer, or the same or different charge auxiliary layers may be disposed between the first electrode and the first light emitting layer and between the second electrode and the second light emitting layer.

In an embodiment, the light emitting layer may include a second light emitting layer disposed between two or more first light emitting layers, a first light emitting layer disposed between two or more second light emitting layers, or a combination thereof. The first light emitting layer may be configured to emit the first light. The second light emitting layer may be configured to emit the second light.

Referring to FIG. 6B, the light emitting element 180 may have a tandem structure, and includes a first electrode 181 and a second electrode 182 facing each other; a first light emitting layer 183a and a second light emitting layer 183b disposed between the first electrode 181 and the second electrode 182; a charge generation layer 186 disposed between the first light emitting layer 183a and the second light emitting layer 183b, and optionally, auxiliary layers 184 and 185 disposed between the first electrode 181 and the first light emitting layer 183a and/or disposed between the second electrode 182 and the second light emitting layer 183b.

The first electrode 181, the second electrode 182, and the auxiliary layers 184 and 185 are as described above.

The first light emitting layer 183a and the second light emitting layer 183b may emit light having the different emission spectra or different maximum emission wavelengths. In an embodiment, the first light emitting layer 183a may emit light of a blue emission spectrum. In an embodiment, the second light emitting layer 183b may emit light of a green emission spectrum. A detailed description is the same as the aforementioned light emitting layer 183.

The charge generation layer 186 may be configured to inject electric charges into the first light emitting layer 183a and/or the second light emitting layer 183b, and may be configured to control a charge balance between the first light emitting layer 183a and the second light emitting layer 183b. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Referring to FIG. 6C, the light emitting element (e.g., having a tandem structure) may include a first electrode 181 and a second electrode 182 facing each other; a first light emitting layer 183a, a second light emitting layer 183b, and a third light emitting layer 183c disposed between the first electrode 181 and the second electrode 182; a first charge generation layer 186a disposed between the first light emitting layer 183a and the second light emitting layer 183b; a second charge generation layer 186b disposed between the second light emitting layer 183b and the third light emitting layer 183c; and optionally, auxiliary layers 184 and 185 disposed between the first electrode 181 and the first light emitting layer 183a and/or disposed between the second electrode 182 and the third light emitting layer 183c.

The first electrode 181, the second electrode 182, and the auxiliary layers 184 and 185 are as described above.

The first light emitting layer 183a, the second light emitting layer 183b, and the third light emitting layer 183c may emit light having the same or different emission spectrum. In an embodiment, the first light emitting layer 183a and the third light emitting layer 183c may emit light of a blue emission spectrum, and the second light emitting layer 183b may emit light of a green emission spectrum. In another embodiment, the first light emitting layer 183a and the third light emitting layer 183c may emit light of a green emission spectrum, and the second light emitting layer 183b may emit light of a blue emission spectrum. A detailed description is the same as described above with respect to the light emitting layer.

The first charge generation layer 186a may be inject electric charges into the first light emitting layer 183a and/or the second light emitting layer 183b, and may control charge balances between the first light emitting layer 183a and the second light emitting layer 183b. The second charge generation layer 186a may inject electric charges into the second light emitting layer 183b and/or the third light emitting layer 183c, and may control charge balances between the second light emitting layer 183b and the third light emitting layer 183c. Each of the first and second charge generation layers 186a and 186b may be one layer or two or more layers.

Referring to 6D, the light emitting element 180 includes a first electrode 181, a second electrode 182, and a light emitting layer 183 including a plurality of nanostructures 187.

One of the first electrode 181 and the second electrode 182 may be an anode and the other may be a cathode. The first electrode 181 and the second electrode 182 may be electrodes patterned according to arrangement directions of the plurality of nanostructures 187, and may include, for example, conductive oxides such as indium tin oxide (ITO), indium zinc oxide (IZO), zinc oxide (ZnO), tin oxide (SnO), aluminum tin oxide (AlTO), and fluorine-doped tin oxide (FTO); silver (Ag), copper (Cu), aluminum (Al), gold (Au), titanium (Ti), chromium (Cr), nickel (Ni), an alloy thereof, a nitride thereof (e.g., TiN); or a combination thereof, but are not limited thereto.

The light emitting layer 183 may include a plurality of nanostructures 187, and each of the sub-pixels $PX_1$, $PX_2$, and $PX_3$ may include a plurality of nanostructures 187. The plurality of nanostructures 187 may be arranged along one direction, but the present disclosure is not limited thereto. The nanostructures 187 may be a compound semiconductor configured to emit light of a predetermined wavelength when an electric current is applied, and may be, for example, linear nanostructures such as nanorods or nanoneedles. The diameter or long diameter of the nanostructures 187 may be, for example, several to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, greater than or equal to about 5.0, about 1 to about 20, about 1.5 to about 20, about 2.0 to about 20, about 3.0 to about 20, about 4.0 to about 20, about 4.5 to about 20, or about 5.0 to about 20.

The nanostructures 187 may include a p-type region 187p, an n-type region 187n, and a multiple quantum well region 187i, and may emit light from the multiple quantum well region 187i. The nanostructures 187 may include, for example, gallium nitride (GaN), indium gallium nitride (InGaN), aluminum gallium nitride (AlGaN), or a combination thereof, and may have, for example, a core-shell structure.

The plurality of nanostructures 187 may emit light having the same or different emission spectra. In an embodiment, a first nanostructure of the plurality of nanostructures 187 may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm.

The display panel according to an embodiment includes the color conversion panel 200. The color conversion panel 200 may receive the incident light of mixed color from the light emitting panel 10 and convert the spectrum of incident light into to an emission spectrum different from the emission spectrum (mixed light) of incident light. The emitted light from the color conversion panel 200 may then be directed out from the device toward an observer (not shown). The color conversion panel includes a color conversion layer including a color conversion region, wherein the color conversion region includes a first region corresponding to a green pixel, wherein the first region includes a first composite, and the first composite includes a matrix and a plurality of luminescent nanostructures dispersed in the matrix and configured to convert the emission spectrum of the incident light as described.

The spectral overlap between the UV-Vis absorption spectrum of the luminescent nanostructures, the maximum emission peak of the first light, and the maximum emission peak of the second light is configured to satisfy the following equation, (e.g., inequality):

$$B/A \leq 0.60.$$

Herein, A is an area where a UV-Vis absorption spectrum of the luminescent nanostructures overlaps with the maximum emission peak of the first light (e.g., blue incident light) in a wavelength region of less than or equal to about 500 nm, and B is an area where a UV-Vis absorption spectrum of the luminescent nanostructures overlaps with the maximum emission peak of the second light (e.g., green incident light) in a wavelength region of greater than (or equal) to about 500 nm.

Herein, for determination of the A, a height of a first absorption peak of the UV-Vis absorption spectrum of the luminescent nanostructures and a height of the maximum emission peak of the first light are adjusted to be equal, and for determination of the B, a height of a first absorption peak of the UV-Vis absorption spectrum of the luminescent nanostructures and a height of the maximum emission peak of the second light are adapted to be equal.

Figure 1B:
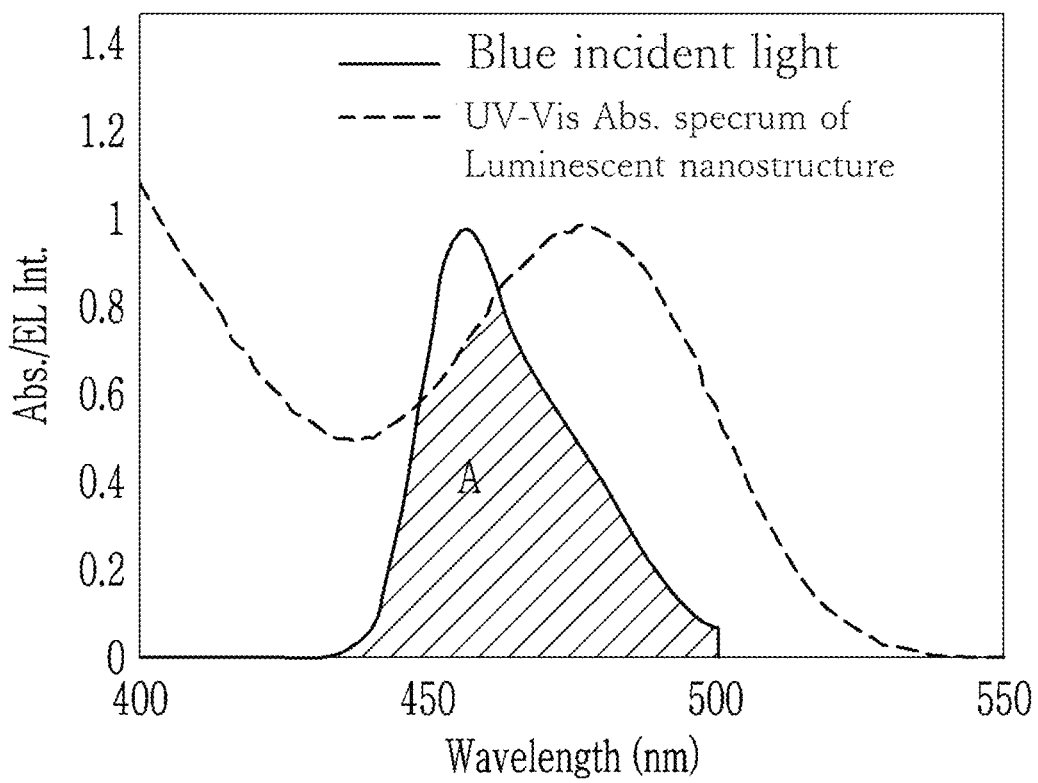
FIG. 1B schematically illustrates a spectral overlapping area between the UV-Vis absorption spectrum of the luminescent nanostructures included in the display panel according to an embodiment and the emission peak of the first light.
Figure 1C:
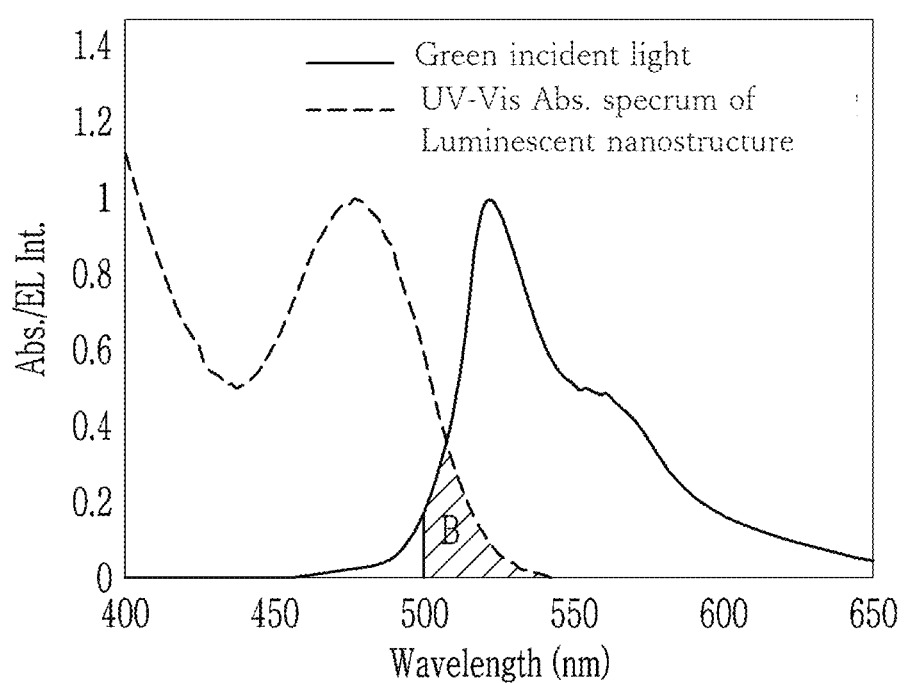
FIG. 1C schematically shows a spectral overlapping area between the UV-Vis absorption spectrum of the luminescent nanostructures included in the display panel and the emission peak of the second light according to an embodiment.

Referring to FIGS. 1B and 10, exemplary or represented overlapping areas A and B are depicted and can be determined by a person of ordinary skill in the art, e.g., a person of skill may use well known analysis software that is often provided with the optical measuring equipment or a commercially available graphic tool such as image J from NIH, Exel®, Origin, or a "Paint" from Windows®.

The B/A value of spectral overlap (ratio) may be less than or equal to 0.62, less than or equal to about 0.61, less than or equal to about 0.6, less than or equal to about 0.59, less than or equal to about 0.58, less than or equal to about 0.57, less than or equal to about 0.56, less than or equal to about 0.55, less than or equal to about 0.54, less than or equal to about 0.53, less than or equal to about 0.52, less than or equal to about 0.51, less than or equal to about 0.5, less than or equal to about 0.49, less than or equal to about 0.48, less than or equal to about 0.47, less than or equal to about 0.46, less than or equal to about 0.45, less than or equal to about 0.44, less than or equal to about 0.43, less than or equal to about 0.42, less than or equal to about 0.41, less than or equal to about 0.4, less than or equal to about 0.39, less than or equal to about 0.38, less than or equal to about 0.37, less than or equal to about 0.36, less than or equal to about 0.35, less than or equal to about 0.34, less than or equal to about 0.33, less than or equal to about 0.32, or less than or equal to about 0.31. The B/A value of spectral overlap may be in the range of about 0.01 to about 0.60, about 0.02 to about 0.48, about 0.03 to about 0.31, about 0.07 to about 0.31, about 0.12 to about 0.20, or any range derived from the stated B/A values.

In a display panel in which the light emitting panel is configured to provide a mixed incident light including green light, in the case of a green pixel, it may be advantageous for the green light of the incident light to be emitted out of the screen as efficiently as possible. However, according to the research conducted by the present inventors, there may exist a section in which the absorption spectrum of the luminescent nanostructures overlaps with the green light absorption spectrum of the incident light. In this case, the green incident light is unnecessarily subjected to color conversion by the luminescent nanostructure, which may lead to a decrease of the efficiency of the entire device.

Specifically, the present inventors have found that the central wavelength of the maximum emission peak of green incident light may be in the range of about 515 nm to about 530 nm, and in this case, a substantial portion of the absorption peak of the green light emitting nanostructures (e.g., the first absorption peak of greater than or equal to about 510 nm) may have significant overlap, and thus, a significant portion of the green incident light may be reabsorbed by the luminescent nanostructures. Consequently, this may likely lead to a decrease in overall efficiency of the display device. For example, when the quantum efficiency of the luminescent nanostructure is about 75% and about 30% of the green incident light is reabsorbed, about 8% of the incident light may be lost due to reabsorption loss.

The present inventors have found that an absorption peak (e.g., a first absorption peak) of the luminescent nanostructures may be in a range of (for example, greater than or equal to about 450 nm, greater than or equal to about 460 nm and) less than or equal to about 500 nm or less than or equal to about 490 nm, and in this case, as the center wavelength of the blue incident light falls on an absorption spectrum region of the green light emitting nanostructure where an absorbance increases with an increase in wavelength, and thus the absorbance of the blue incident light may be improved. In this regard, it may be considered to blue-shift the absorption spectrum of the luminescent nanostructures capable of emitting green light so as not to be overlapped with the green incident light. However, the present inventors have found that such a blue shift may also affect the emission spectrum of the luminescent nanostructures. In the color conversion panel, the maximum emission peak (or the maximum photoluminescence peak wavelength) of the green light emitting nanostructures or the central wavelength thereof present in a range of about 520 nm to about 550 nm may be desired to realize improved color gamut. Surprisingly, the present inventors have found that by controlling a spectral overlap of the absorption spectrum of the luminescent nanostructures with an emission spectrum of the first light having a predetermined wavelength range and an emission spectrum of the second light having the predetermined wavelength range, unnecessary color conversion of green incident light may be suppressed, and as a result, the green pixel may emit light of a desired wavelength with improved efficiency.

The present inventors have also found that the luminescent nanostructures included in the color conversion panel may need to have an increased absorbance per weight. The present inventors have found that absorbance at 350 nm may reflect a weight factor of the luminescent nanostructures, and thus, by adjusting a ratio of the absorbance at 450 nm to the absorbance at 350 nm (e.g., to provide a ratio of greater than or equal to about 0.2) may further help to improve the luminous efficiency of the device.

With reference to the drawings, the color conversion panel is further described. Referring to FIG. 1, the color conversion panel 200 according to an embodiment further includes a partition wall (e.g., a black matrix (BM), a bank, or both) to define each region of the color conversion layer 270. The color conversion layer may be a patterned film of a composite including the luminescent nanostructures. The color conversion region includes a first region 270b configured to (e.g., receive the incident light and) convert an emission spectrum of the incident light to a green light spectrum. The first region 270b may correspond to a green pixel. The first region 270b includes a first (light emitting) composite. In an embodiment, the first composite includes a matrix (e.g., a polymer matrix) 273b and a plurality of luminescent nanostructures (hereinafter also referred to as nanostructures) 271b dispersed in the matrix 273b. The term "nanostructure" refers to luminescent nanostructure(s). The first composite (or the first region) is configured to emit green light.

A maximum emission peak wavelength of the green light (or the plurality of luminescent nanostructures) may be greater than or equal to about 500 nm, greater than or equal to about 501 nm, greater than or equal to about 504 nm, greater than or equal to about 505 nm, greater than or equal to about 510 nm, greater than or equal to about 515 nm, or greater than or equal to about 520 nm. The maximum emission peak wavelength of the green light (or the plurality of luminescent nanostructures) may be less than or equal to about 550 nm, less than or equal to about 545 nm, less than or equal to about 540 nm, less than or equal to about 530 nm, less than or equal to about 525 nm, less than or equal to about 520 nm, less than or equal to about 515 nm, or less than or equal to about 510 nm. A difference between the wavelength of the first absorption peak of the luminescent nanostructure(s) and the wavelength of the maximum photoluminescence peak of the luminescent nanostructure(s) is greater than or equal to 45 nm, greater than or equal to 50, greater than or equal to 55 nm, and less than or equal to 65 nm, less than or equal to about 60 nm, or less than or equal to about 56 nm.

The color conversion region includes a (e.g., one or more) second region 270a configured to emit light (e.g., red light) of a color different from the green light (e.g., by irradiation with incident light), and the second region 270a may include a second composite. The second composite includes a matrix (e.g., a polymer matrix) 273a and a plurality of luminescent nanostructures 271a dispersed in the matrix 273a. The luminescent nanostructure composite of the second region may include luminescent nanostructures that emit light of a different wavelength (e.g., a different color or red color) from the luminescent nanostructure composite of the first region.

The color conversion panel may further include (one or more) third regions 270c that emit or allow blue light of the incident light to pass through. The third region 270c may include a third composite, and the third composite includes a matrix (e.g., a polymer matrix) 273c with or without a luminescent nanostructure. A maximum peak wavelength of the blue light may include blue light in a range of greater than or equal to about 380 nm (e.g., greater than or equal to about 440 nm, greater than or equal to about 445 nm, greater than or equal to about 450 nm, or greater than or equal to about 455 nm) and less than or equal to about 480 nm (less than or equal to about 475 nm, less than or equal to about 470 nm, less than or equal to about 465 nm, or less than or equal to about 460 nm).

Moreover, light scatterers 272a, 272b, and 272c may also be included in the respective composites in order to scatter incident light.

Referring to FIGS. 5A and 5B, the color conversion panel 200 (e.g., the color conversion layer 270) includes a surface(s) opposite a surface(s) of the light emitting panel, i.e., the color conversion panel 200 of the embodiment faces the light emitting element 180 of the light emitting panel 100. The color conversion panel 200 (e.g., color conversion layer 270) of an embodiment may include at least one color conversion region for converting an emission spectrum of light supplied from the light emitting panel 100 into light of a different emission spectrum. The color conversion region may, for example, convert light in the emission spectrum supplied from the light emitting panel 100 into light in the emission spectrum of the color displayed by each of the sub-pixels $PX_1$, $PX_2$, and $PX_3$. The color conversion panel 200 of an embodiment may further include an upper substrate 210, a light blocking pattern or a black matrix 220, a color filter layer or a first optical device 230, a planarize layer 240, a partition wall 250 (250a and 250b), the color conversion layer 270 (270a, 270b, and 270c), an encapsulation layer 290, or a combination thereof.

In an embodiment, the luminescent nanostructures included in the first composite include a first semiconductor nanocrystal including a Group III-V compound and a second semiconductor nanocrystal including a zinc chalcogenide. The nanostructures may have a core-shell structure including a core and a shell disposed on the core. The first semiconductor nanocrystal may be included in the core. The second semiconductor nanocrystal may be included in the shell. The luminescent nanostructures do not contain cadmium. The luminescent nanostructures may not contain cadmium, lead, mercury, or a combination thereof.

The Group III-V compound includes indium, phosphorus; and optionally zinc. The Group III-V compound may further include gallium. The Group III-V compound may include indium phosphide, indium gallium phosphide, indium zinc phosphide, indium zinc gallium phosphide, or a combination thereof.

The first semiconductor nanocrystal or the core may be an emission center of the luminescent nanostructure. The size (e.g., average size) of the first semiconductor nanocrystal or the core may be appropriately selected in consideration of the photoluminescence wavelength. For example, the size (e.g., average size) of the first semiconductor nanocrystal or the core may be greater than or equal to about 1 nm, greater than or equal to about 1.5 nm, greater than or equal to about 1.8 nm, or greater than or equal to about 2 nm. For example, the size (e.g., average size) of the core may be less than or equal to about 5 nm, less than or equal to about 4 nm, less than or equal to about 3 nm, or less than or equal to about 2.5 nm.

In an embodiment, the nanostructure further includes a second semiconductor nanocrystal or a shell including zinc chalcogenide. The outermost surface of the nanostructure may include zinc, selenium, and sulfur. In other words, at least a portion of the surface of the luminescent nanostructures may include the second semiconductor nanocrystals (e.g., zinc chalcogenide including zinc, selenium, and sulfur). According to an embodiment, a portion adjacent to the first semiconductor nanocrystal in the second semiconductor nanocrystal includes a ZnSeS alloy containing ZnS, and thus electrons in the first semiconductor nanocrystal can be efficiently confined due to a bandgap wider than that of ZnSe, and lattice mismatch may be reduced. According to an embodiment, improved high-temperature stability may be realized by having an increased sulfur content in the second semiconductor nanocrystal (e.g., toward the surface of the luminescent nanostructure).

The zinc chalcogenide included in the second semiconductor nanocrystal may include ZnSe, ZnSeS, ZnS, or a combination thereof. The second semiconductor nanocrystal or the zinc chalcogenide may include ZnSeS. The second semiconductor nanocrystal may include a combination of a first zinc chalcogenide containing ZnSe and a second zinc chalcogenide containing ZnS.

A thickness of the second semiconductor nanocrystal or the (monolayered) shell may be about 6 ML or less, about 5.5 ML or less, about 5 ML or less, about 4.5 ML or less, about 4 ML or less, about 3.5 ML or less, about 3 ML or less, or about 2.5 ML or less. The thickness of the second semiconductor nanocrystal (or the shell) may be about 2 ML or more, about 2.5 ML or more, about 3 ML or more, or about 3.5 ML or more.

The thickness of the second semiconductor nanocrystal (or the shell) may be less than or equal to about 2.5 nm, less than or equal to about 2.4 nm, less than or equal to about 2.3 nm, less than or equal to about 2.2 nm, less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.55 nm, less than or equal to about 1.5 nm, less than or equal to about 1.45 nm, less than or equal to about 1.4 nm, or less than or equal to about 1.35 nm. The thickness of the second semiconductor nanocrystal (or the shell) may be greater than or equal to about 0.5 nm, greater than or equal to about 0.6 nm, greater than or equal to about 0.7 nm, greater than or equal to about 0.8 nm, greater than or equal to about 0.9 nm, or greater than or equal to about 1 nm.

In an embodiment, the shell may include a monolayered shell including the second semiconductor nanocrystal. The monolayer may have a composition that changes in a thickness direction. In the monolayer, the concentration of sulfur may exhibit an increasing gradient towards the surface of the luminescent nanostructure.

In an embodiment, the shell may be a multi-layered shell including two or more layers in which adjacent layers have different compositions. The multi-layered shell may include a first layer which is disposed on the semiconductor nanocrystalline core and includes zinc, selenium, and optionally sulfur, and a second layer which is disposed on the first layer and includes zinc, sulfur, and optionally selenium. The second layer may include an increased content of sulfur than the first layer. The first layer or the second layer may include ZnSe, ZnS, ZnSeS, or a combination thereof. The first layer may be disposed over (or directly on) the semiconductor nanocrystal core. The second layer may be disposed on (e.g., directly on) the first layer. The second shell may be an outermost layer of the quantum dots.

When the shell is a multi-layered shell, the thickness of the first layer may be less than or equal to about 1 nm, less than or equal to about 0.9 nm, less than or equal to about 0.8 nm, less than or equal to about 0.7 nm, or less than or equal to about 0.6 nm. The thickness of the first layer may be greater than or equal to about 0.3 nm, greater than or equal to about 0.4 nm, or greater than or equal to about 0.5 nm. The thickness of the second layer may be less than or equal to about 1 nm, less than or equal to about 0.9 nm, less than or equal to about 0.8 nm, less than or equal to about 0.7 nm, or less than or equal to about 0.6 nm. The thickness of the second layer may be greater than or equal to about 0.3 nm, greater than or equal to about 0.4 nm, or greater than or equal to about 0.5 nm.

When confirmed by compositional analysis (for example, inductively coupled plasma-atomic emission analysis, etc.) of the structure, the thickness of ZnSe or the first layer in the luminescent nanostructure or the shell of an embodiment may be about 4 monolayers (ML) or less, about 3.5 ML or less, about 3 ML or less, about 2.5 ML or less, about 2.3 ML or less, or about 2 ML or less. In an embodiment, the thickness of the ZnSe or the first layer in the luminescent nanostructure (or the shell) may be about 0.5 ML or more, about 1 ML or more, about 1.5 ML or more, about 2 ML or more, or about 2.3 ML or more. When confirmed by the composition ratio, the thickness of the ZnSe or the first layer in the luminescent nanostructure (or the shell) of an embodiment may be less than or equal to about 1.2 nm, less than or equal to about 1 nm, less than or equal to about 0.9 nm, less than or equal to about 0.8 nm, or less than or equal to about 0.7 nm and/or greater than or equal to about 0.3 nm, greater than or equal to about 0.5 nm, or greater than or equal to about 0.55 nm.

When confirmed by compositional analysis (for example, inductively coupled plasma-atomic emission analysis, etc.) of the structure, the thickness of ZnS or the second layer in the luminescent nanostructure or the shell of an embodiment may be less than or equal to about 1 nm, for example, less than or equal to about 0.9 nm, less than or equal to about 0.8 nm, less than or equal to about 0.7 nm, or less than or equal to about 0.6 nm. As confirmed by compositional analysis, the thickness of ZnS or the second layer in the luminescent nanostructure (or the shell) of an embodiment may be greater than or equal to about 0.3 nm, greater than or equal to about 0.4 nm, or greater than or equal to about 0.5 nm. The thickness of the ZnS or the second layer may be about 0.5 ML or more, about 1 ML or more, about 1.5 ML or more, about 2 ML or more, or about 2.5 ML or more and about 5 ML or less, about 4 ML or less, about 3 ML or less, about 2.5 ML or less, about 2 ML or less, or about 1.5 mL or less.

In the luminescent nanostructures of an embodiment, a mole ratio of sulfur to selenium (S:Se) is greater than or equal to about 2:1. The mole ratio of sulfur to selenium may be greater than about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.52:1, greater than or equal to about 2.55:1, greater than or equal to about 2.6:1, greater than or equal to about 2.62:1, greater than or equal to about 2.65:1, or greater than or equal to about 2.7:1. In nanostructure of an embodiment, the mole ratio of sulfur to selenium may be less than or equal to about 10:1, less than or equal to about 8:1, less than or equal to about 6:1, less than or equal to about 5.5:1, less than or equal to about 5:1, less than or equal to about 4.5:1, less than or equal to about 4:1, less than or equal to about 3.7:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, or less than or equal to about 2.1:1.

In the luminescent nanostructures, a mole ratio of sulfur to indium (S:In) may be greater than or equal to about 3:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 6.5:1, greater than or equal to about 7:1, greater than or equal to about 7.5:1, greater than or equal to about 8:1, greater than or equal to about 8.5:1, greater than or equal to about 9:1, greater than or equal to about 9.5:1, greater than or equal to about 10:1, greater than or equal to about 10.5:1, or greater than or equal to about 11:1. In the luminescent nanostructures, a mole ratio of sulfur to indium may be less than or equal to about 20:1, less than or equal to about 19:1, less than or equal to about 18:1, less than or equal to about 17:1, less than or equal to about 16:1, less than or equal to about 15:1, less than or equal to about 14.5:1, less than or equal to about 14:1, less than or equal to about 13.5:1, less than or equal to about 13:1, less than or equal to about 12.5:1, less than or equal to about 12:1, or less than or equal to about 11.5:1.

In the luminescent nanostructures, a mole ratio of selenium to indium (Se:In) may be less than or equal to about 10:1, less than or equal to about 9:1, less than or equal to about 8:1, less than or equal to about 7:1, less than or equal to about 6.5:1, less than or equal to about 6:1, less than or equal to about 5.5:1, less than or equal to about 5:1, less than or equal to about 4.8:1, or less than or equal to about 4.5:1. The mole ratio of selenium to indium (Se:In) may be greater than or equal to about 1:1, greater than or equal to about 1.5:1, greater than or equal to about 2:1, greater than or equal to about 2.5:1, greater than or equal to about 3:1, greater than or equal to about 3.5:1, or greater than or equal to about 3.8:1, or greater than or equal to about 4:1.

In nanostructure of an embodiment, a mole ratio of zinc to indium (Zn:In) may be less than or equal to about 30:1, less than or equal to about 29:1, less than or equal to about 28:1, less than or equal to about 27:1, less than or equal to about 26:1, less than or equal to about 25:1, less than or equal to about 24:1, less than or equal to about 23:1, less than or equal to about 22:1, less than or equal to about 21:1, less than or equal to about 20:1, less than or equal to about 19:1, less than or equal to about 18:1, less than or equal to about 17:1, less than or equal to about 16:1, less than or equal to about 15:1, or less than or equal to about 14:1. In nanostructure of an embodiment, the mole ratio of zinc to indium (Zn:In) may be greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, greater than or equal to about 11:1, greater than or equal to about 12:1, greater than or equal to about 13:1, greater than or equal to about 14:1, greater than or equal to about 15:1, greater than or equal to about 16:1, greater than or equal to about 17:1, greater than or equal to about 18:1, greater than or equal to about 19:1, or greater than or equal to about 19.5:1.

In the luminescent nanostructures, a mole ratio of phosphorus to indium (P:In) may be greater than or equal to about 0.7:1, greater than or equal to about 0.75:1, greater than or equal to about 0.8:1, greater than or equal to about 0.85:1, greater than or equal to about 0.88:1, greater than or equal to about 0.89:1, greater than or equal to about 0.9:1, greater than or equal to about 0.93:1, or greater than or equal to about 0.95:1. The mole ratio of phosphorus to indium (P:In) may be less than or equal to about 1.5:1, less than or equal to about 1.4:1, less than or equal to about 1.3:1, less than or equal to about 1.2:1, less than or equal to about 1.05:1, less than or equal to about 1.03:1, less than or equal to about 1:1, less than or equal to about 0.98:1, less than or equal to about 0.97:1, less than or equal to about 0.96:1, or less than or equal to about 0.95:1.

In the nanostructure of an embodiment, a mole ratio of indium to a chalcogen element (e.g., a sum of S and Se) (In:(S+Se)) may be greater than or equal to about 0.05:1, greater than or equal to about 0.06:1, greater than or equal to about 0.062:1, or greater than or equal to about 0.065:1. In nanostructure of an embodiment, the mole ratio of indium to a chalcogen element (e.g., a sum of S and Se) (In:(S+Se)) may be less than or equal to about 0.15:1, less than or equal to about 0.14:1, less than or equal to about 0.13:1, less than or equal to about 0.12:1, less than or equal to about 0.11:1, less than or equal to about 0.105:1, less than or equal to about 0.1:1, less than or equal to about 0.095:1, less than or equal to about 0.09:1, less than or equal to about 0.085:1, less than or equal to about 0.08:1, or less than or equal to about 0.075:1.

In nanostructure of an embodiment, a mole ratio of zinc to a chalcogen element (e.g., a sum of S and Se) (Zn:(S+Se)) may be greater than or equal to about 1:1, greater than or equal to about 1.05:1, greater than or equal to about 1.1:1, greater than or equal to about 1.15:1, greater than or equal to about 1.2:1, greater than or equal to about 1.25:1, or greater than or equal to about 1.3:1. In nanostructure of an embodiment, a mole ratio of zinc to a chalcogen element (e.g., a sum of S and Se) may be less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.45:1, or less than or equal to about 1.4:1.

As used herein, the presence and content (ratio) of elements (e.g., metals, non-metals, and halogens) included in the luminescent nanostructures are easily and reproducibly determined by an appropriate analytical means (e.g., X-ray photoelectron spectroscopy (XPS), inductively coupled plasma atomic emission spectroscopy (ICP-AES), ion chromatography, Rutherford backscattering spectroscopy (RBS), time-of-flight secondary ion mass spectrometry (TOFSIMS), or a combination thereof).

In an embodiment, a method of manufacturing the luminescent nanostructures includes preparing first semiconductor nanocrystals (or core particles including the same) including indium (In) and phosphorus (P) and optionally zinc; and in the presence of the first semiconductor nanocrystals (or core particles including the same) and an organic ligand, reacting a zinc precursor; and at least one of a selenium precursor and a sulfur precursor simultaneously or sequentially (e.g., in an organic solvent) to form a second semiconductor nanocrystal (or a shell including the same, hereinafter also referred to as a second semiconductor nanocrystal); wherein during the formation of the second semiconductor nanocrystals, the selenium precursor and the sulfur precursor are injected so that at least a portion of the surface of the final luminescent nanostructures includes all of sulfur, selenium, and zinc. In an embodiment, during the formation of the second semiconductor nanocrystals, the selenium precursor and the sulfur precursor may be injected so that a portion adjacent to the core may include both selenium and sulfur.

In the method, the selenium precursor and the sulfur precursor may be injected so that, in the final luminescent nanostructures, the thickness of the second semiconductor nanocrystal may be about 5 ML or less (or less than or equal to about 2 nm, or less than or equal to about 1.5 nm) and/or the mole ratio of sulfur to selenium may be greater than about 2.

In an embodiment, the preparation of the first semiconductor nanocrystals (or core particles including the same) may include heating an indium compound in the presence of a second organic ligand and an organic solvent to prepare an indium precursor solution; and injecting a phosphorus precursor into the indium precursor solution followed by heating the obtained mixture. The method may further include obtaining a zinc precursor first before the preparing of the indium precursor solution, wherein the preparing of the indium precursor solution is performed in the presence of the zinc precursor. Depending on the type, the zinc precursor may be obtained by heating a zinc compound and an organic ligand at a high temperature (e.g., a temperature of greater than or equal to about 100° C. and less than or equal to about 200° C.) in an organic solvent. In the core synthesis, the mole ratio of zinc to indium may be greater than or equal to about 1:1, greater than about 1:1, greater than or equal to about 1.1:1, or greater than or equal to about 1.2:1 and less than or equal to about 3:1, less than or equal to about 2.5:1, or less than or equal to about 2:1. In an embodiment, the zinc precursor and the indium precursor may include a carboxylate moiety. The moles of the carboxylic acid-containing organic ligand to 1 mole of the metal in the zinc precursor (or the indium precursor) may be greater than or equal to about 1 mole, greater than or equal to about 1.5 moles, or greater than or equal to about 2 moles, and less than or equal to about 5 moles, less than or equal to about 4 moles, or less than or equal to about 3 moles.

In an embodiment, a reaction system for forming the second semiconductor nanocrystals may include a sulfur precursor and a selenium precursor at the same time. In the formation of the second semiconductor nanocrystals, the mixture including the zinc precursor, the first organic ligand, and the organic solvent may be heated to a predetermined temperature (e.g., greater than or equal to about 100° C., greater than or equal to about 120° C., greater than or equal to about 130° C., greater than or equal to about 140° C., greater than or equal to 150° C., greater than or equal to about 200° C., greater than or equal to about 230° C., greater than or equal to about 250° C., and less than or equal to about 340° C., less than or equal to about 320° C., less than or equal to about 310° C., less than or equal to about 300° C., less than or equal to about 280° C., less than or equal to about 250° C., less than or equal to about 230° C., or a temperature range of any combination of the threshold values described herein). The first semiconductor nanocrystals, the selenium precursor, and the sulfur precursor (e.g., a thiol compound, a reaction product of an alkyl phosphine compound and sulfur, or a combination thereof) are injected into the heated mixture. The selenium precursor and the sulfur precursor may be injected (e.g., each independently one or more times or two or more times) to form a shell having a desired composition. The injection method of each precursor is not particularly limited, and may be performed simultaneously or sequentially.

The forming of the second semiconductor nanocrystals may include forming a first layer including zinc, selenium, and sulfur on the first semiconductor nanocrystals, and forming a second layer including zinc, selenium, and sulfur on the first layer. During shell formation, the respective content of each precursor (e.g., zinc precursor, sulfur precursor, and/or selenium precursor) may be adjusted by considering the structure/composition of the final core-shell quantum dot.

The type of the zinc precursor is not particularly limited and may be appropriately selected. For example, the zinc precursor may be Zn metal powder, an alkylated Zn compound, Zn alkoxide, Zn carboxylate, Zn nitrate, Zn percholate, Zn sulfate, Zn acetylacetonate, Zn halide, Zn cyanide, Zn hydroxide oxide, Zn oxide, Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc precursor may be used alone or in combination of 2 or more types. As noted above, in an embodiment, the formation of the second semiconductor nanocrystals may proceed without the use of zinc chloride.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, wherein R and R' are each independently a substituted or unsubstituted C1 to C40 (or C3 to C24) aliphatic hydrocarbon group (e.g., an alkyl group, an alkenyl group, an alkynyl group), or a substituted or unsubstituted C6 to C40 (or C6 to C24) aromatic hydrocarbon group (e.g., C6 to C20 aryl group)), or a combination thereof. The organic ligand may coordinate the surface of the obtained nanocrystals and render the nanocrystal well-dispersed in the solution and/or affect light emitting and/or electrical characteristics of quantum dots. An example of the organic ligand may include a thiol such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; a carboxylic acid such as methanoic (formic) acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)), and the like; a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphineoxide etc.), a substituted or unsubstituted propyl phosphine oxide, a substituted or unsubstituted butyl phosphine oxide, or a substituted or unsubstituted octylphosphine oxide (e.g., trioctylphosphine oxide (TOPO)), and the like; diphenyl phosphine, triphenyl phosphine compound, or an oxide compound thereof; phosphonic acid; a C5 to C20 alkylphosphinic acid such as hexylphosphinic acid, octylphosphinic acid, dodecanephosphinic acid, tetradecanephosphinic acid, hexadecanephosphinic acid, octadecanephosphinic acid; or a C5 to C20 alkyl phosphonic acid; and the like, but are not limited thereto. The organic ligand may be used alone or as a mixture of two or more.

The organic solvent may be selected from a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenylhexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether; and a combination thereof. A type and an amount of the solvent may be appropriately selected considering precursors and organic ligands.

The type of the indium precursor is not particularly limited and may be appropriately selected. The indium precursor may include an indium powder, an alkylated (e.g., a C1-C8 alkylated) indium compound, indium alkoxide (e.g., a C1-018 (e.g., a C1-C8) alkoxide), an indium carboxylate (e.g., a C1-C18 carboxylate), indium nitrate, indium percholate, indium sulfate, indium acetylacetonate, indium halide, indium cyanide, indium hydroxide, indium oxide, indium peroxide, indium carbonate, or a combination thereof. The indium precursor may include indium carboxylate such as indium oleate and indium myristate, indium acetate, indium hydroxide, indium chloride, indium bromide, and indium iodide. The formation of the indium precursor may be performed under vacuum at a temperature of greater than or equal to about 100° C., or greater than or equal to about 120° C. and less than or equal to about 200° C.

The type of the phosphorus precursor is not particularly limited and may be appropriately selected. The phosphorus precursor may be tris(trimethylsilyl) phosphine, tris(dimethylamino) phosphine, triethylphosphine, tributylphosphine, trioctylphosphine, triphenylphosphine, tricyclohexylphosphine, dimethyl Aminophosphine, diethylaminophosphine, or a combination thereof.

The mixture obtained by injection of the phosphorus precursor in the formation of the first semiconductor nanocrystals or core particles may be heated to a temperature of greater than or equal to about 150° C., greater than or equal to about 200° C., greater than or equal to about 250° C., or greater than or equal to about 270° C. and less than or equal to about 300° C., less than or equal to about 290° C., less than or equal to about 280° C., less than or equal to about 270° C., or less than or equal to about 260° C. During the core formation process, if necessary, a precursor (e.g., an indium precursor, a phosphorus precursor, and/or a zinc precursor) may be additionally injected one or more times.

The core formation reaction time is not particularly limited and may be appropriately selected in consideration of the reactivity between precursors and the core formation temperature.

The type of the selenium precursor is not particularly limited and may be appropriately selected. For example, the selenium precursor may include seleniumtrioctylphosphine (Se-TOP), selenium-tributylphosphine (Se-TBP), selenium-triphenylphosphine (Se-TPP), or a combination thereof, but is not limited thereto. The selenium precursor may be injected once or more (e.g., two or more times).

In the method of an embodiment, a sulfur precursor may be injected at the initial stage of formation of the second semiconductor nanocrystals (e.g., first layer) (hereinafter, a first sulfur precursor). The sulfur precursor may be injected again at the later stage of formation of the second semiconductor nanocrystals (e.g., second layer) (hereinafter, a second sulfur precursor). The first sulfur precursor may include a thiol compound. The second sulfur precursor may include sulfur dispersed in an alkyl phosphine. The thiol compound may include a thiol compound (e.g., dodecanethiol) having an aliphatic hydrocarbon group having 4 to 20 carbon atoms, such as alkanethiol. The second sulfur precursor may include an organic solvent dispersion of a sulfur powder (e.g., sulfur-octadecene (S-ODE), sulfur-trioctylphosphine (S-TOP), sulfur-tributylphosphine (S-TBP), sulfur-triphenylphosphine (S-TPP), sulfur-trioctylamine (S-TOA), or trimethylsilyl sulfur), mercaptopropyl silane, trimethylsilyl sulfide, ammonium sulfide, sodium sulfide, or a combination thereof. The content ratio between the first sulfur precursor and the second sulfur precursor may be appropriately selected. The content ratio between the first sulfur precursor and the second sulfur precursor may be about 1:0.1 to about 1:10, about 1:0.2 to about 1:5, about 1:0.3 to about 1:3, about 1:0.4 to about 1:2.5, about 1:0.5 to about 1:2, or a combination of the respective boundary values.

The second semiconductor nanocrystal (or shell) formation temperature may be appropriately selected. In an embodiment, the second semiconductor nanocrystal (or shell) forming temperature may be greater than or equal to about 240° C., greater than or equal to about 270° C., greater than or equal to about 280° C., greater than or equal to about 290° C., greater than or equal to about 300° C., greater than or equal to about 310° C., or greater than or equal to about 315° C. In an embodiment, the shell forming temperature may be less than or equal to about 350° C., less than or equal to about 340° C., less than or equal to about 330° C., or less than or equal to about 325° C. The formation temperature of the first layer and the second layer may be the same or different.

In an embodiment, the temperature at which the first layer is formed may be higher than the temperature at which the second layer is formed. In an embodiment, the temperature at which the first layer is formed may be lower than the temperature at which the second layer is formed. A difference between the first layer formation temperature and the second layer formation temperature may be greater than or equal to about 10° C., greater than or equal to about 20° C., greater than or equal to about 30° C., greater than or equal to about 40° C., greater than or equal to about 50° C., or greater than or equal to about 60° C.

The reaction time for forming the second semiconductor nanocrystals (or shell) is not particularly limited and may be appropriately selected. For example, the forming reaction time of the second semiconductor nanocrystals (or shell) may be, for example, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, or greater than or equal to about 1 hour, but is not limited thereto. The reaction time for forming the second semiconductor nanocrystals (or shell) may be less than or equal to about 3 hours.

Each precursor/compound may be added in a single step or in multiples during formation of the second semiconductor nanocrystals (or shell). When the precursor or the like is added in stages, the reaction may be performed for a predetermined time (e.g., greater than or equal to about 5 minutes, greater than or equal to about 10 minutes, or greater than or equal to about 15 minutes) in each step. The reaction may be performed in an inert gas atmosphere or in air, or in a vacuum, but is not limited thereto.

In forming the second semiconductor nanocrystals (e.g., first layer or second layer), the selenium precursor may be added one or more times (e.g., two or more times or three or more times).

When the forming of the second semiconductor nanocrystals (or shell) includes the formation of the first layer and the second layer, the respective reaction time may be appropriately selected according to a desired shell composition, types of the precursors, and a reaction temperature.

Formation of the second semiconductor nanocrystals (or shell) (or formation of the first layer and/or second layer) is performed (e.g. independently each other) for greater than or equal to about 40 minutes, for example, greater than or equal to about 50 minutes, greater than or equal to about 60 minutes, greater than or equal to about 70 minutes, greater than or equal to about 80 minutes, or greater than or equal to about 90 minutes. The reaction time for forming the second semiconductor nanocrystals (or shell) (or forming the first layer and/or the second layer) may be (e.g. independently of each other) less than or equal to about 4 hours, for example, less than or equal to about 3 hours, less than or equal to about 2 hours, less than or equal to about 1 hour, or less than or equal to about 30 minutes.

In in the reaction system for forming the shell, the content of selenium per 1 mole of indium may be greater than or equal to about 2 moles, greater than or equal to about 3 moles and less than or equal to about 23 moles, less than or equal to about 20 moles, less than or equal to about 10 moles, less than or equal to about 5 moles.

In the reaction system for forming the shell, the content of sulfur per 1 mole of indium may be greater than or equal to about 2 moles, greater than or equal to about 6 moles, greater than or equal to about 7 moles, greater than or equal to about 8 moles, greater than or equal to about 9 moles, or greater than or equal to about 10 moles, and less than or equal to about 20 moles, less than or equal to about 14 moles, less than or equal to about 13 moles, less than or equal to about 12 moles, less than or equal to about 11 moles, less than or equal to about 10 moles, or less than or equal to about 9.5 moles.

In the reaction system for forming the shell, the content of sulfur per 1 mole of indium may be greater than or equal to about 3 moles, greater than or equal to about 6 moles, greater than or equal to about 7 moles, greater than or equal to about 8 moles, greater than or equal to about 9 moles, or greater than or equal to about 10 moles, and less than or equal to about 14 moles, less than or equal to about 13 moles, less than or equal to about 12 moles, less than or equal to about 11 moles, less than or equal to about 10 moles, or less than or equal to about 9.5 moles.

In the reaction system for forming the shell, the content of the thiol compound per 1 mole of indium may be greater than or equal to about 1 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles, and less than or equal to about 14 moles, less than or equal to about 13 moles, less than or equal to about 12 moles, less than or equal to about 11 moles, less than or equal to about 10 moles, or less than or equal to about 9.5 moles.

In the reaction system for forming the shell, the content of the second sulfur precursor per 1 mol of indium may be greater than or equal to about 0 mole, greater than or equal to about 1 mole, greater than or equal to about 3 moles, greater than or equal to about 5 moles, greater than or equal to about 7 moles, greater than or equal to about 9 moles, greater than or equal to about and 10 moles, and less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

The addition of a nonsolvent to the prepared final reaction solution may allow nanocrystals coordinated with the organic ligands to be separated (e.g. precipitated). The nonsolvent may be a polar solvent that is miscible with the solvent used in the reaction and nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as needed. The washing solvent is not particularly limited, and a solvent having a solubility parameter similar to that of the organic solvent or ligand may be used. Non-solvents or washing solvents include alcohol; alkane solvents such as hexane, heptane, and octane; chloroform; aromatic solvents such as toluene and benzene; or a combination thereof, but is not limited thereto.

The luminescent nanostructures may be dispersed in a dispersion solvent. The luminescent nanostructures may form an organic solvent dispersion. The organic solvent dispersion may not include water and/or an organic solvent miscible with water. The dispersion solvent may be appropriately selected. The dispersion solvent may include the organic solvent described above. The dispersion solvent may include a substituted or unsubstituted C1 to C40 aliphatic hydrocarbon, a substituted or unsubstituted C6 to C40 aromatic hydrocarbon, or a combination thereof.

The luminescent nanostructures of an embodiment may have (absolute) quantum efficiency of greater than or equal to about 80%, greater than or equal to about 81%, greater than or equal to about 82%, greater than or equal to about 83%, greater than or equal to about 84%, greater than or equal to about 85%, or greater than or equal to about 90%. The luminescent nanostructures may have a full width at half maximum (FWHM) of 55 nm or less, for example, less than or equal to about 55 nm, for example, less than or equal to about 50 nm, less than or equal to about 45 nm, less than or equal to about 44 nm, less than or equal to about 43 nm, less than or equal to about 42 nm, less than or equal to about 41 nm, or less than or equal to about 40 nm. The luminescent nanostructures may have a full width at half maximum width (FWHM) of greater than or equal to about 40 nm, greater than or equal to about 42 nm, or greater than or equal to about 43 nm in a dispersed state in an organic solvent. The luminescent nanostructures may have a full width at half maximum (FWHM) of less than or equal to about 50 nm in a dispersed state in an organic solvent.

An (e.g., average) size of the luminescent nanostructures may be greater than or equal to about 1 nm, greater than or equal to about 2 nm, greater than or equal to about 3 nm, greater than or equal to about 4 nm, or greater than or equal to about 5 nm. The luminescent nanostructures may have a reduced size while being configured to emit green light. The (average) size may be less than or equal to about 10 nm, less than or equal to about 9 nm, less than or equal to about 8 nm, less than or equal to about 7 nm, less than or equal to about 6.5 nm, less than or equal to about 6 nm, less than or equal to about 5.5 nm, less than or equal to about 5 nm, or less than or equal to about 4.95 nm. The size may be a particle diameter.

The size (when the luminescent nanostructures are not spherical) may be a diameter calculated by converting a two-dimensional area confirmed by transmission electron microscopy analysis into a circle. The size may be a value calculated from the composition of the quantum dots. A dimension such as size (e.g., a dimension related to the luminescent nanostructures) herein may refer to an average dimension (e.g., average size).

Shapes of the luminescent nanostructures are not particularly limited, and may include, for example, spherical, polyhedral, pyramidal, multi-pod, or cubic, nanotubes, nanowires, nanofibers, nanosheets, or a combination thereof, but are not limited thereto.

The luminescent nanostructures may include the aforementioned organic ligand and/or organic solvent on the surface. The organic ligand and/or the organic solvent may be bound to the surface of the luminescent nanostructures.

The luminescent nanostructures of an embodiment, as defined in part by the UV-Vis absorption spectrum, may have an absorbance ratio of an absorbance at a first absorption peak or at a wavelength of about 450 nm with respect to absorbance at a wavelength of about 350 nm of greater than or equal to about 0.78:1, greater than or equal to about 0.09:1, greater than or equal to about 0.1:1, greater than or equal to about 0.11:1, greater than or equal to about 0.12:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, or greater than or equal to about 0.26:1. In the UV-Vis absorption spectrum of the luminescent nanostructures, an absorbance ratio of absorbance at the first absorption peak wavelength or at a wavelength of about 450 nm with respect to absorbance at a wavelength of about 350 nm may be less than or equal to about 0.4:1, less than or equal to about 0.3:1, less than or equal to about 0.29:1, less than or equal to about 0.28:1, less than or equal to about 0.27:1, less than or equal to about 0.26:1, or less than or equal to about 0.255:1. The luminescent nanostructures of an embodiment, as defined in part by the UV-Vis absorption spectrum, may have an absorbance ratio that may be defined by a range derived from any maximum and minimum ratio stated above.

The luminescent nanostructures may exhibit a UV-Vis absorption spectrum curve having a positive differential coefficient value (i.e., a tangential slope) at about 450 nm. (Refer to FIG. 1B) The differential coefficient value may be greater than about 0, for example, greater than or equal to about 0.001, greater than or equal to about 0.002, greater than or equal to about 0.003, greater than or equal to about 0.004, greater than or equal to about 0.005, or greater than or equal to about 0.006. The differential coefficient value may be less than or equal to about 0.03, less than or equal to about 0.025, less than or equal to about 0.02, less than or equal to about 0.015, less than or equal to about 0.01, less than or equal to about 0.0095, less than or equal to about 0.009, or less than or equal to about 0.0085. The luminescent nanostructures of an embodiment may exhibit increased efficiency with increased absorbance for incident light sources greater than or equal to about 450 nm and less than or equal to 470 nm. The derivative of df(x)/dx, (tangential slope) at about 450 nm in the UV-Vis absorption curve may be easily measured by simple analysis of the curve.

In the UV-Vis absorption spectrum of the luminescent nanostructures, the first absorption peak wavelength may be within a range of greater than about 450 nm and less than the photoluminescence peak wavelength. The first absorption peak wavelength may be, for example, in a range of greater than or equal to about 455 nm, greater than or equal to about 460 nm, greater than or equal to about 465 nm, greater than or equal to about 470 nm, greater than or equal to about 475 nm, or greater than or equal to about 480 nm. The first absorption peak wavelength may be in the range of less than or equal to about 505 nm, less than or equal to about 500 nm, less than or equal to about 495 nm, or less than or equal to about 490 nm.

The luminescent nanostructures may be configured to have, in their UV-Vis absorption spectrum, a valley depth defined by the equation below of greater than or equal to about 0.2, greater than or equal to about 0.25, greater than or equal to about 0.3, greater than or equal to about 0.35, or greater than or equal to about 0.4:

$$1-(\text{Abs}_{valley}/\text{Abs}_{first})=VD$$

wherein, $\text{Abs}_{first}$ is absorbance at the first absorption peak, and $\text{Abs}_{valley}$ is absorbance at the lowest point of the valley adjacent to the first absorption peak.

In the UV-Vis absorption spectrum of the luminescent nanostructures, the lowest point of the valley may be in a wavelength range of less than or equal to about 450 nm and greater than or equal to about 400 nm or greater than or equal to about 420 nm.

The first composite of an embodiment may be prepared from a composition including the luminescent nanostructure(s) (e.g., in a solid state via polymerization or the like).

The composition may include (e.g., a plurality of) the luminescent nanostructure(s) of an embodiment; optionally a monomer, a dispersant, or a combination thereof; and (organic) solvents (and/or liquid vehicles). The dispersant may disperse the quantum dots. The dispersant may include a carboxylic acid group-containing compound (monomer or polymer). The composition may further include a (photo) polymerizable monomer including a carbon-carbon double bond, and optionally (thermal or photo) initiator. The composition may be a photosensitive composition.

Details of the luminescent nanostructures in the composition are as described above. The content of the luminescent nanostructures in the composition may be appropriately adjusted in consideration of an end use (e.g., such as a color conversion layer of a luminescent-type color filter or color conversion panel). In the composition (or composite) of an embodiment, the content of quantum dot(s) greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on the total weight or total solids of the composition or composite. The content of the luminescent nanostructures may be less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 30 wt %, based on the total weight or total solids of the composition or composite.

Herein, the content based on the total solids in the composition (e.g., when the composition includes an organic solvent) may correspond to the content of the corresponding component in the quantum dot composite. For example, in the case of a solvent-free system in which the composition does not include an organic solvent, the content range in the composition may correspond to the content range in the composite.

In the composition according to an embodiment, the dispersant may contribute to ensuring dispersibility of the luminescent nanostructures or metal oxide particulates as will be described below. In an embodiment, the dispersant may include an organic compound (e.g., a monomer or a polymer) (e.g., including a carboxylic acid group), for example, a binder polymer. The dispersant or binder polymer may be an insulating polymer.

The carboxylic acid group-containing organic compound may include a monomer combination including a first monomer including a carboxylic acid group and a carbon-carbon double bond, a second monomer having a carbon-carbon double bond and a hydrophobic moiety and not having a carboxylic acid group, and optionally a third monomer having a carbon-carbon double bond and a hydrophilic moiety and not having a carboxylic acid group, or a copolymer thereof;

a multiple aromatic ring-containing polymer including a carboxylic acid group (—COOH) and having a backbone structure wherein two aromatic rings are bound to a quaternary carbon atom being a constituent atom of another cyclic moiety in the main chain; or a combination thereof (hereinafter, cardo binder); or a combination thereof.

The dispersant may include the first monomer, the second monomer, and, optionally, the third monomer.

In the composition, the content of the dispersant (or binder polymer) may be greater than or equal to about 0.5 wt %, for example, greater than or equal to about 1 wt %, greater than or equal to about 5 wt %, greater than or equal to about 10 wt %, greater than or equal to about 15 wt %, greater than or equal to about 20 wt %, greater than or equal to about 30 wt %, greater than or equal to about 40 wt %, or greater than or equal to about 50 wt % based on the total weight or total solids of the composition or composite, but is not limited thereto. The content of the dispersant (or binder polymer) may be less than or equal to about 60 wt %, less than or equal to about 50 wt %, less than or equal to about 40 wt %, less than or equal to about 35 wt %, less than or equal to about 33 wt %, less than or equal to about 30 wt %, less than or equal to about 20 wt %, or less than or equal to about 10 wt % based on the total weight or total solids of the composition or composite. The content of the dispersant (or binder polymer) may be about 0.5 wt % to about 55 wt % based on the total weight or total solids of the composition or composite.

The composition may include a polymerizable (e.g., photopolymerizable) monomer including the carbon-carbon double bond. The monomer may include (e.g., photopolymerizable) (meth)acryl-based monomer. The monomer may be a precursor for an insulating polymer.

The content of the monomer may be greater than or equal to about 0.5 wt %, for example, greater than or equal to about 1 wt %, greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt % based on the total weight or total solids of the composition or composite. The content of the photopolymerizable monomer may be less than or equal to about 60 wt %, less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on the total weight or total solids of the composition or composite.

The (photo)initiator in the composition may be used for (photo)polymerization of the aforementioned monomers The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, the content of the initiator may be appropriately adjusted considering types and contents of the polymerizable monomers. In an embodiment, the content of the initiator may be greater than or equal to about 0.01 wt %, for example, greater than or equal to about 1 wt %, greater than or equal to about 5 wt %, greater than or equal to about 10 wt %, and/or less than or equal to about for example, 9 wt %, less than or equal to about 8 wt %, less than or equal to about 7 wt %, less than or equal to about 6 wt %, or less than or equal to about 5 wt % based on the total weight (or total solid content weight) of the composition, but is not limited thereto.

The composition may further include a (multiple or mono-functional) thiol compound having at least one thiol group at the terminal end, a metal oxide particulate, or a combination thereof.

The metal oxide particulate may include $TiO_2$, $SiO_2$, $BaTiO_3$, $Ba_2TiO_4$, $ZnO$, or a combination thereof.

In the composition, the content of the metal oxide particulate may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, or greater than or equal to about 35 wt % and/or less than or equal to about 60 wt %, less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt % based on the total weight (or total solid content weight) of the composition. The metal oxide particulates may be non-luminescent. Herein, the term metal oxide may include oxides of metals or semi-metals.

The metal oxide particulate may have an appropriately selected diameter without a particular limit. The diameter of the metal oxide particulate may be greater than or equal to about 100 nm, for example greater than or equal to about 150 nm or greater than or equal to about 200 nm and less than or equal to about 1000 nm, less than or equal to about 800 nm, less than or equal to about 500 nm, less than or equal to about 400 nm, or less than or equal to about 300 nm.

The (multiple) thiol compound may be a dithiol compound, a trithiol compound, a tetrathiol compound, or a combination thereof. For example, the thiol compound may be glycoldi-3-mercaptopropionate, glycoldimercaptoacetate, trimethylolpropanetris (3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

The content of the (multiple) thiol compound may be less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on the total weight (or total solid content weight) of the composition. The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt % based on the total weight (or total solid content weight) of the composition.

The composition may further include an organic solvent (or a liquid vehicle, hereinafter referred to as a solvent). Types of the usable solvent are not particularly limited. Non-limiting examples of the solvent or liquid vehicle may be ethyl 3-ethoxy propionate; ethylene glycols such as ethylene glycol, diethylene glycol, polyethylene glycol, and the like; glycolethers such as ethylene glycol monomethylether, ethylene glycol monoethylether, diethyleneglycol monomethylether, ethylene glycol diethylether, diethylene glycol dimethylether, and the like; glycol ether acetates such as ethyleneglycol monomethylether acetate, ethylene glycol monoethylether acetate, diethylene glycol monoethylether acetate, diethylene glycol monobutylether acetate, and the like; propylene glycols such as propylene glycol, and the like; propylene glycolethers such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol ether acetates such as propylene glycol monomethyl ether acetate, dipropylene glycol monoethylether acetate, and the like; amides such as N-methylpyrrolidone, dimethyl formamide, dimethyl acetamide, and the like; dimethylsulfoxide; ketones such as methylethylketone (MEK), methylisobutylketone (MIBK), cyclohexanone, and the like; petroleums such as solvent naphtha, and the like; esters such as ethyl acetate, butyl acetate, or ethyl lactate; ethers such as diethyl ether, dipropyl ether, dibutyl ether, and the like, tetrahydrofuran, chloroform, C1 to C40 aliphatic hydrocarbon (e.g., alkane, alkene, or alkyne), a halogen- (e.g., chlorine-) substituted C1 to C40 aliphatic hydrocarbon (e.g., dichloroethane, trichloromethane, etc.), C6 to C40 aromatic hydrocarbon (e.g., toluene, xylene, etc.), a halogen- (e.g., chlorine-) substituted C6 to C40 aromatic hydrocarbon, or a combination thereof, but is not limited thereto.

The type and amount of the organic solvent are appropriately determined in consideration of the types and amounts of the aforementioned main components (i.e., quantum dots, dispersants, polymerizable monomers, initiators, and if present thiol compounds), and other additives described later. The composition includes the solvent in an amount other than the desired solid content (non-volatile component) amount.

The composition (e.g., inkjet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs.

When used in inkjet, the composition is discharged to the substrate at room temperature, and may form a first composite film or a pattern thereof, for example, by heating. The ink composition may have, while having the aforementioned viscosity, the surface tension at 23° C. of greater than or equal to about 21 milliNewton per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. The ink composition may have a surface tension of less than or equal to about 31 mN/m, less than or equal to about 30 mN/m, less than or equal to about 29 mN/m, or less than or equal to about 28 mN/m.

The composition of an embodiment may further include, for example, an additive included in a composition for a photoresist or an ink composition. The additive may include a light diffusing agent, a leveling agent, a coupling agent, and the like. The contents of US-2017-0052444-A1 may be referred to for additional details of such materials and their applicability to ink compositions.

The composition according to an embodiment may be prepared by a method including: preparing quantum dot dispersion including the aforementioned luminescent nanostructures of an embodiment, dispersant, and solvent; and mixing the quantum dot dispersion with an initiator; the polymerizable monomers (e.g., acryl-based monomers); optionally, with a thiol compound; optionally, with a metal oxide particulate, and optionally, the aforementioned additives. Each of the aforementioned components may be mixed sequentially or simultaneously, but mixing orders are not particularly limited.

The composition according to an embodiment may be used to provide a pattern of a quantum dot composite (e.g., a quantum dot polymer composite). The composition may provide the quantum dot-polymer composite by (e.g., radical) polymerization. The composition according to an embodiment may be a quantum dot-containing photoresist composition to which a photolithography process may be applied. The composition according to an embodiment may be an ink composition that may provide a pattern by printing (e.g., a droplet discharge method such as inkjet printing).

In an embodiment, the color conversion layer (or the patterned film of the quantum dot-polymer composite) may be prepared using a photoresist composition. The method may include forming a film of the aforementioned composition on a substrate; optionally prebaking the film; exposing a selected region of the film to light (e.g., a wavelength of less than or equal to about 400 nm); and developing the exposed film with an alkali developing solution to obtain a pattern of the quantum dot-polymer composite.

Figure 9A:
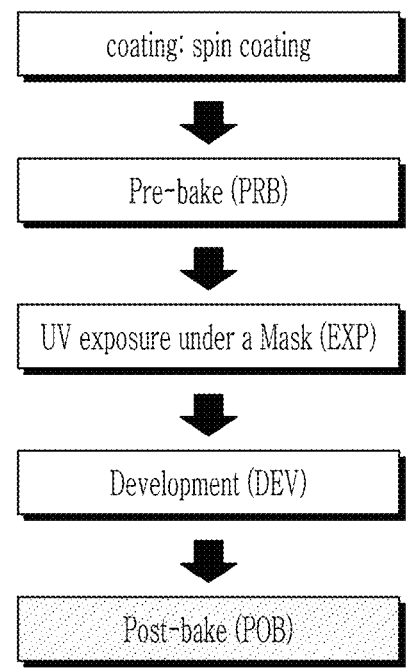
FIG. 9A schematically shows a pattern forming process using the composition of an embodiment.
Figure 9A:

Referring to FIG. 9A, the aforementioned composition is coated to have a predetermined thickness on a substrate in an appropriate method of spin coating, slit coating, and the like. The formed film may be, optionally, pre-baked (PRB). The prebaking may be performed by selecting an appropriate condition from known conditions of temperature, time, atmosphere, and the like.

The formed (or optionally pre-baked) film is exposed to light having a predetermined wavelength under a mask with a predetermined pattern. A wavelength and intensity of the light may be selected considering types and amounts of the photoinitiator, types and amounts of the quantum dots, and the like.

The exposed film is treated with an alkali developing solution (e.g., dipping or spraying) to dissolve an unexposed region of the composite to obtain a desired pattern. The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes).

When the color conversion layer or the patterned film of the quantum dot composite has a plurality of repeating sections (i.e., color conversion regions), a quantum dot composite having a desired pattern may be obtained by preparing a plurality of compositions including a quantum dot having desired luminescence properties (a photoluminescence peak wavelength and the like), and depositing the compositions to form the repeating sections (e.g., a red light emitting quantum dot, a green light emitting quantum dot, or optionally, a blue light emitting quantum dot). The print pattern may be repeated as necessary (e.g., two or more times or three or more times) repeating the aforementioned pattern formation process to obtain a quantum dot-polymer composite having desired pattern. For example, the quantum dot-polymer composite may have a pattern of at least two repetitive color sections (e.g., RGB sections). Such a quantum dot-polymer composite pattern may be used as a photoluminescent type color filter in a display device.

Figure 9B:
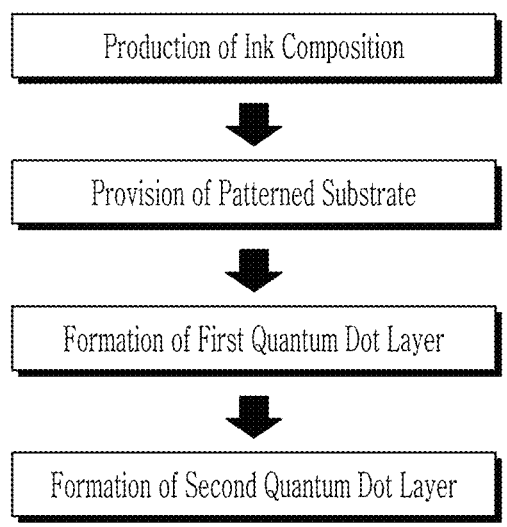
FIG. 9B schematically illustrates a pattern forming process using the ink composition of an embodiment.

The color conversion layer or the patterned film of the quantum dot composite may be produced using an ink composition configured to form a pattern in an inkjet method. Referring to FIG. 9B, the method may include providing an ink composition, providing a substrate (e.g., in which pixel area is patterned by an electrode and optionally, a bank, etc.); depositing the ink composition on the substrate (or the pixel area) to provide, for example, a first quantum dot layer (or first region); and depositing an ink composition on the substrate (or the pixel area) to provide, for example, a second quantum dot layer (or second region). The formation of the first quantum dot layer(s) (region(s)) and the second quantum dot layer(s) (region(s)) may be conducted simultaneously or sequentially.

The depositing an ink composition may be performed using an appropriate liquid drops discharger such as an inkjet or nozzle printing system (e.g., having an ink storage and at least one print head). The deposited ink composition may provide a (first or second) quantum dot layer through the solvent removal and polymerization by the heating. The method may provide a highly precise quantum dot-polymer composite film or patterned film in a relatively short time in a cost-effective manner.

A first composite (e.g., polymer composite, hereinafter also referred to as quantum dot composite) including the luminescent nanostructure may include a (polymer) matrix; and the luminescent nanostructure(s) of one embodiment dispersed within the matrix. The quantum dot composite may further include metal oxide particles dispersed in the matrix. The (polymer) matrix may include a crosslinked polymer and/or a linear polymer. The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit.

In the quantum dot composite, the contents of quantum dots and metal oxide particulates are the same as described above. In the quantum dot composite, the content of the matrix may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %. In the quantum dot composite, the content of the matrix may be less than or equal to about 90 wt %, less than or equal to about 80 wt %, less than or equal to about 70 wt %, less than or equal to about 60 wt %, less than or equal to about 50 wt %, or less than or equal to about 40 wt %. In the quantum dot composite, the sum of the quantum dot and metal oxide particulates may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %. In the quantum dot composite, the content of the matrix may be less than or equal to about 90 wt %, less than or equal to about 80 wt %, less than or equal to about 70 wt %, less than or equal to about 60 wt %, less than or equal to about 50%, or less than or equal to about 40 wt %.

The matrix may include the aforementioned dispersant (e.g., carboxylic acid group-containing binder monomer or polymer), a polymerization product (e.g., insulating polymer) of a polymerizable monomer having a carbon-carbon double bond (at least one, for example, at least two, at least three, at least four, or at least five), and a polymerization product of the polymerizable monomer and a thiol compound having at least one (e.g., two or more) thiol groups.

In an embodiment, the polymer matrix may include a crosslinked polymer, a linear polymer, or a combination thereof. The crosslinked polymer may include a thiolene resin, a crosslinked poly(meth)acrylate, or a combination thereof. In an embodiment, the crosslinked polymer may be a polymerization product of the aforementioned polymerizable monomer and optionally a (multiple) thiol compound. Descriptions of the quantum dots, dispersant, polymerizable monomer, and (multiple) thiol compound are the same as described above.

The color conversion panel may further have an incident light blocking layer, a color filter layer, or a first optical filter layer (hereinafter, referred to as a first optical filter layer) on each composite. The first optical filter layer may be disposed between the bottom surfaces of the first section (R) and the second section (G) and the substrate (e.g., an upper substrate) or on the upper surface of the substrate. The first optical filter layer may be a sheet having an opening in a portion corresponding to a pixel region (third section) displaying blue, and thus may be formed in portions corresponding to the first and second sections. That is, the first optical filter layer may be integrally formed at positions other than the position overlapped with the third section, but the present disclosure is not limited thereto. Two or more first optical filter layers may be spaced apart from each other at positions overlapped with the first and second sections, and optionally, the third section. When the light source includes a green light emitting element, a green light blocking layer may be disposed on the third section.

The first optical filter layer may block light having, for example, a predetermined wavelength region in the visible light region and may transmit light in the other wavelength regions, and for example, it may block blue light (or green light) and may transmit light except the blue light (or green light). The first optical filter layer may transmit, for example, green light, red light, and/or light of yellow which is a mixed color thereof. The first optical filter layer may transmit blue light and block green light, and may be disposed on the blue light emitting pixel.

The first optical filter layer may substantially block incident light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emitting section, and the first optical filter layer configured to selectively transmit green light may be disposed at a position overlapped with the green light emitting section. The first optical filter layer may include at least one of a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm), and a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). When the light source emits blue and green mixed light, the first optical filter layer may further include a third region that selectively transmits blue light and blocks green light.

The first region may be disposed at a position overlapped with the green light emitting section. The second region may be disposed at a position overlapped with the red light emitting section. The third region may be disposed at a position overlapped with the blue light emitting section.

The first region, the second region, and, optionally, the third region may be optically isolated. Such a first optical filter layer may contribute to improvement of color purity of the display device.

A protective layer, a second optical filter layer, or a combination thereof may be disposed between the display panel and the color conversion panel. The protective layer may include a transparent insulating material. The second optical filter layer that transmits at least a portion of the third light (incident light) and reflects at least a portion of the first light and/or the second light (e.g., recycling red/green light or yellow light) may be further included. The first light may be red light, the second light may be green light, and the third light may be blue light. For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and directed outside of the display device.

The second optical filter layer or the first optical filter layer may be formed as an integrated layer having a relatively planar surface.

The first optical filter layer may include a polymer thin film including a dye and/or a pigment absorbing light in a wavelength which is to be blocked. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. It may be formed by laminating two layers having different refractive indexes. For example, the first/second optical filter layer may be formed by alternately laminating a material having a high refractive index and a material having a low refractive index.

Hereinafter, it will be described in more detail with reference to FIG. 5A. The color filter layer 230 is disposed in a direction in which light passing through the color conversion layer 270 is emitted, e.g. through the upper substrate 210. The color filter layer 230 may include color filters 230a, 230b, and 230c disposed in each sub-pixel $PX_1$, $PX_2$, and $PX_3$ and selectively transmitting light of different wavelength spectra. The color filters 230a, 230b, and 230c may selectively transmit light of each same wavelength spectrum as the color displayed in each sub-pixel $PX_1$, $PX_2$, and $PX_3$ and also, selectively transmit light of the emission spectrum converted in each region of the color conversion layer 270.

For example, the first sub-pixel $PX_1$, the second sub-pixel $PX_2$, and the third sub-pixel $PX_3$ respectively display red, green, and blue, and when light of each red emission spectrum, green emission spectrum, and blue emission spectrum is emitted from the first color conversion region 270a, the second color conversion region 270b, and the light transmitting region 270c, the first color filter 230a overlaps with the first color conversion region 270a and may be a red filter, the second color filter 230b overlaps with the second color conversion region 270b and may be a green filter, and the third color filter 230c overlaps with the light transmitting region 270c and may be a blue filter. The first color filter 230a, the second color filter 230b, or the third color filter 230c may include a pigment or a dye that selectively transmits light of a red wavelength spectrum, a green wavelength spectrum, or a blue wavelength spectrum, but absorbs and/or reflects light of the other wavelength spectra.

The color filter layer 230 may more precisely filter light emitted from the color conversion layer 270 and thus enhance color purity of the light emitted toward the upper substrate 210. For example, the first color filter 230a overlapped with the first color conversion region 270a may block (or reduce transmission of) light not converted by the quantum dot 271a of the first color conversion region 270a, and transmit the converted light to enhance color purity of light, e.g., light with a red emission spectrum. For example, the second color filter 230b overlapped with the second color conversion region 270b may block (or reduce transmission of) light not converted by the quantum dot 271b of the second color conversion region 270b, and transmit the converted light to enhance color purity of light, e.g., light with a green emission spectrum. For example, the third color filter 230c overlapped with the light transmitting region 270c may block light other than light of the blue emission spectrum and for example, enhance color purity of light with a blue emission spectrum. For example, at least some of the first, second, and third color filter 230a, 230b, and 230c may be omitted, and for example, the third color filter 230c overlapped with the light transmitting region 270c may be omitted.

The light blocking pattern 220 may partition each sub-pixel $PX_1$, $PX_2$, and $PX_3$ and be disposed between the neighboring sub-pixels $PX_1$, $PX_2$, and $PX_3$. The light blocking pattern 220 may be, for example, a black matrix. The light blocking pattern 220 may be overlapped with the edges of the neighboring color filters 230a, 230b, and 230c.

The planarization layer 240 may be disposed between the color filter layer 230 and the color conversion layer 270, and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, or an oxynitride, for example, silicon oxide, silicon nitride, silicon oxynitride, or a combination thereof, but is not limited thereto. The planarization layer 240 may be one layer or two or more layers, and may cover the entire surface of the upper substrate 210.

The encapsulation layer 290 may cover the color conversion layer 270 and the partition wall 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one or two or more layers.

A light transmitting layer 300 may be disposed between the light emitting panel 100 and the color conversion panel 200. The light transmitting layer 300 may be, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

The aforementioned display panel may be included in various electronic devices. The electronic device may include, but is not limited to, various display devices, sensor devices, solar cells, imaging sensors, photodetectors, and the like. The luminescent nanostructure of an embodiment may be included in an electronic device. Such an electronic device may include a portable terminal device, a monitor, a notebook PC, a television, an electronic display, a camera, an automobile, and the like, but are not limited thereto. The electronic device may be a portable terminal device including a display device (or light emitting element) including quantum dots, a monitor, a notebook PC, or a television. The electronic device may be a camera or a portable terminal device including an image sensor including quantum dots. The electronic device may be a camera or a vehicle including a photodetector including quantum dots.

Hereinafter, the embodiments are illustrated in more detail with reference to examples. However, they are exemplary examples of the present disclosure, and the present disclosure is not limited thereto.

EXAMPLES

Analysis Methods
[1] UV-Vis Spectroscopy

An UV-Vis spectroscopy analysis is performed using an Agilent Cary5000 spectrophotometer to obtain an UV-Visible absorption spectrum. The obtained absorption spectrum is used to obtain each of absorbances at 350 nm and 450 nm, respectively, which is then used to calculate an absorbance ratio as follows:

Absorbance ratio=$A450/A350$

A450: Absorbance at 450 nm
A450: Absorbance at 350 nm

[2] ICP Analysis

Inductively coupled plasma atomic emission spectroscopy (ICP-AES) is performed by using Shimadzu ICPS-8100.

[3] Calculation of Spectral Overlap Ratio:

Based on the UV-Vis absorption spectrum of given quantum dots and the luminescent spectrum of the blue-green light source, A and B are measured and B/A (Spectral overlap ratio) is calculated. Herein, A corresponds to an area where a UV-Vis absorption spectrum of the luminescent nanostructures overlaps with the maximum emission peak of the first light (blue light) in a wavelength range of less than or equal to about 500 nm, and B corresponds to an area where a UV-Vis absorption spectrum of the luminescent nanostructures overlaps with the maximum emission peak of the second light (green light) in a wavelength range of greater than about 500 nm.

[4] Incident Light Absorbance and Light Conversion Rate

The UV-Vis absorption spectrum and the photoemission spectrum of the given quantum dots are used to measure a blue incident light absorbance and a light conversion rate according to the following equation.

Light conversion rate (%)=$A/B$

Blue light absorbance (%)=$[(B-B')/B] \times 100(\%)$

A: light dose of green light emitted from the composite and having a wavelength of greater than about 500 nm.
B: light dose of blue incident light having a wavelength of less than or equal to about 500 nm
B': light dose of blue incident light having a wavelength of less than or equal to about 500 nm that has passed through the quantum dots Reference Example 1: Preparation of InZnP Core Zinc acetate and oleic acid are dissolved into 1-octadecene in a 250 mL reaction flask and heated at 120° C. under vacuum and then cooled to a room temperature to provide a zinc oleate solution.

Indium acetate and lauric acid are added to the reaction flask and heated to 120° C. under vacuum. After 1 hour, nitrogen is added to the reaction flask. A mixed solution of tris(trimethylsilyl)phosphine (TMS3P) and trioctylphosphine is rapidly injected into the reaction flask as the temperature in the reaction flask is raised to 250° C., and the reaction proceeds. When the reaction is completed, the reaction solution is cooled to room temperature, a nonsolvent (acetone) is added to facilitate precipitation, and then, the reaction mixture is centrifuged to separate the precipitate, and the precipitate is dispersed in toluene.

Herein, indium, zinc, and phosphorus are used in a mole ratio of 6:7:4.5. As a result of performing an absorption spectrum analysis with respect to the obtained InZnP core, the core has a first absorption wavelength of about 430 nm.

Example 1

(1) Selenium is dispersed in trioctylphosphine to prepare a Se/TOP stock solution, and sulfur is dispersed in trioctylphosphine to prepare a S/TOP stock solution.

In a 2 L flask, zinc acetate and oleic acid are dissolved in trioctylamine and then, vacuum-treated at 120° C. for 10 minutes. Nitrogen is added to the reaction flask and the reaction solution is heated to a reaction temperature of 280° C. The toluene dispersion of the first semiconductor nanocrystals according to Reference Example 1, Se/TOP, and dodecanethiol are added to the reaction flask. As the reaction is proceeding, the S/TOP stock solution is added to the reaction solution to obtain a reaction solution including luminescent nanostructures including first semiconductor nanocrystals and second semiconductor nanocrystals on at least a portion of the surface of the first semiconductor nanocrystals.

Total reaction time is 75 minutes, and a content of precursors per 1 mole of indium is adjusted to have an ICP composition shown in Table 1. The dodecanethiol and S/TOP have a mole ratio of 1:0.4.

After adding an excessive amount of ethanol to the reaction solution, the luminescent nanostructures (hereinafter, referred to as QD) are separated with a centrifuge. After the centrifugation, the supernatant is discarded, and the collected precipitate is dried and dispersed in toluene, obtaining a luminescent nanostructure solution (hereinafter, a QD solution).

(2) An ICP-AES analysis of the obtained QD is performed, and the results are shown in Table 1. A UV-vis spectroscopy analysis of the obtained QD (in a solution or composite state) is performed, and the results are shown in Table 2.

Example 2

A luminescent nanostructure is obtained according to the same method as Example 1 except that the contents of Se/TOP and the sulfur precursor relative to 1 mole of indium and the reaction time are adjusted to have a composition and a size shown in Table 1.

An ICP-AES analysis and a UV-vis spectroscopy analysis of the obtained QD are performed, and the results are shown in Tables 1 and 2.

Comparative Examples 1, 2, and 3

Selenium is dispersed in trioctylphosphine to prepare a Se/TOP stock solution, and sulfur is dispersed in trioctylphosphine to prepare a S/TOP stock solution. In a 200 mL reaction flask, zinc acetate and oleic acid are dissolved in trioctylamine and then, vacuum-treated at 120° C. for 10 minutes. Nitrogen is added to the reaction flask as the obtained solution is heated to 320° C., and the toluene dispersion of the first semiconductor nanocrystals is added to the flask. A predetermined amount of Se/TOP is added to the flask over several separate portions to form a ZnSe layer on the first semiconductor nanocrystals. Subsequently, the S/TOP stock solution is added to the reaction solution at the reaction temperature to form a ZnS layer on the ZnSe layer. The total reaction time is set to be 40 minutes, and the contents of the Se and S precursors based on 1 mole of indium are adjusted to have a composition shown in Table 1.

An ICP-AES analysis and a UV-vis spectroscopy analysis of the obtained QD are performed, and the results are shown in Tables 1 and 2.

TABLE 1

|  | Mole ratio | | | | QD size |
| --- | --- | --- | --- | --- | --- |
|  | Zn:In | Se:In | (Se + S):In | S:Se |  |
| Example 1 | 16.9:1 | 4.4:1 | 13.9:1 | 2.2:1 | 4.9 |
| Example 2 | 21:1 | 4.5:1 | 17.1:1 | 2.9:1 | 5.4 |
| Comp. Example 1 | 40.4:1 | 20.2:1 | 34.6:1 | 0.71:1 | 6.9 |
| Comp. Example 2 | 11.9:1 | 1.0:1 | 9.7:1 | 8.7:1 | 4.3 |
| Comp. Example 3 | 14:1 | 4.0:1 | 11.6:1 | 1.9:1 | 4.8 |

TABLE 2

|  | First absorption peak wavelength (nm) | A450:A350 |
| --- | --- | --- |
| Example 1 | About 465 | 0.21:1 |
| Example 2 | About 480 | 0.15:1 |

TABLE 2-continued

|  | First absorption peak wavelength (nm) | A450:A350 |
| --- | --- | --- |
| Comparative Example 1 | About 510 | 0.11:1 |
| Comparative Example 2 | About 450 | 0.13:1 |
| Comparative Example 3 | About 497 | 0.15:1 |

Experimental Examples

Figure 7A:
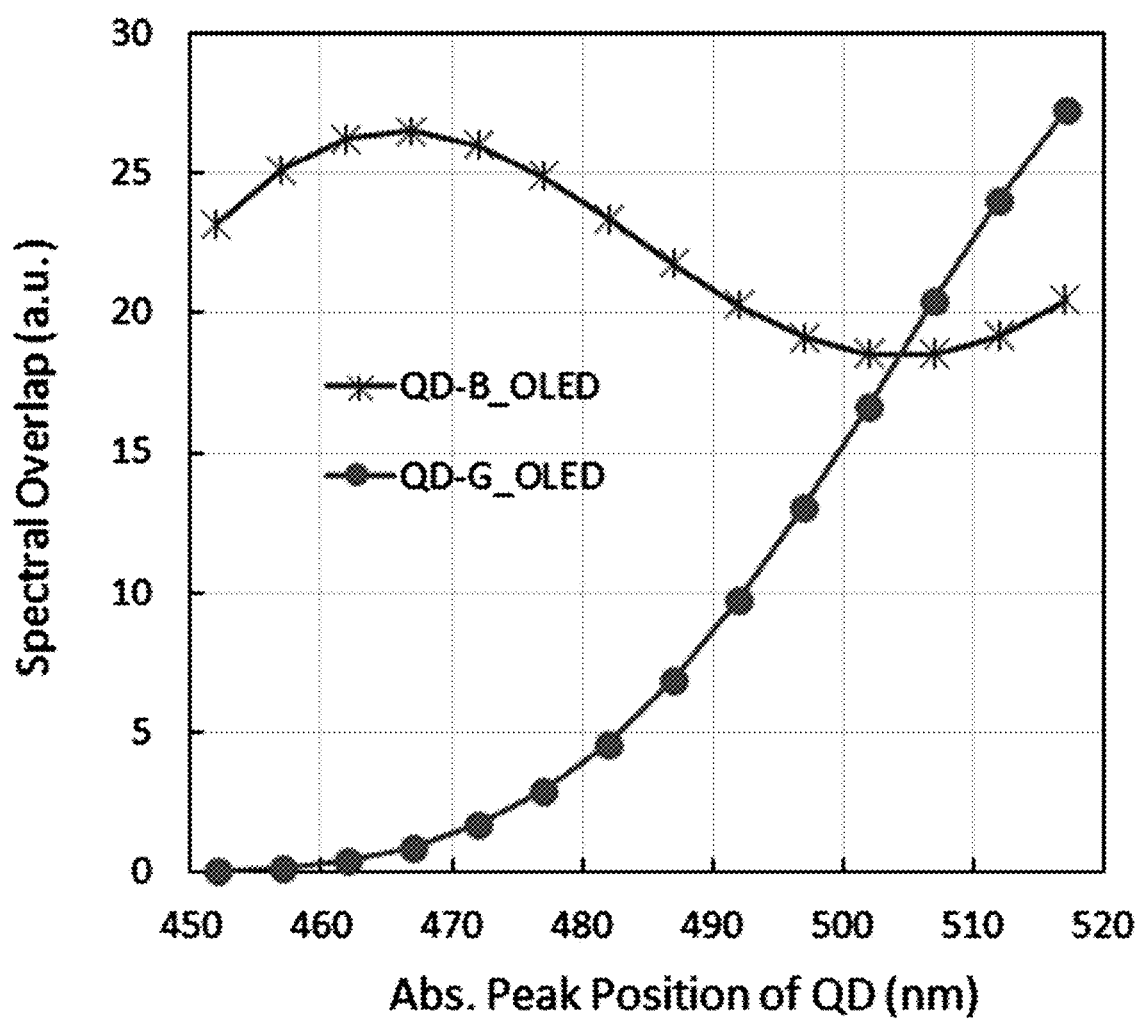
FIG. 7A shows a relationship of the spectral overlaps (A or B) for blue (or green) incident lights with a UV-Vis absorption spectrum of luminescent nanostructures versus a first absorption peak wavelength of luminescent nanostructures (Abs. Peak Position of QD) (nm), which is obtained by considering the results of UV-Vis absorption spectroscopy analysis for the luminescent nanostructures prepared in Examples and Comparative Examples.
Figure 7B:
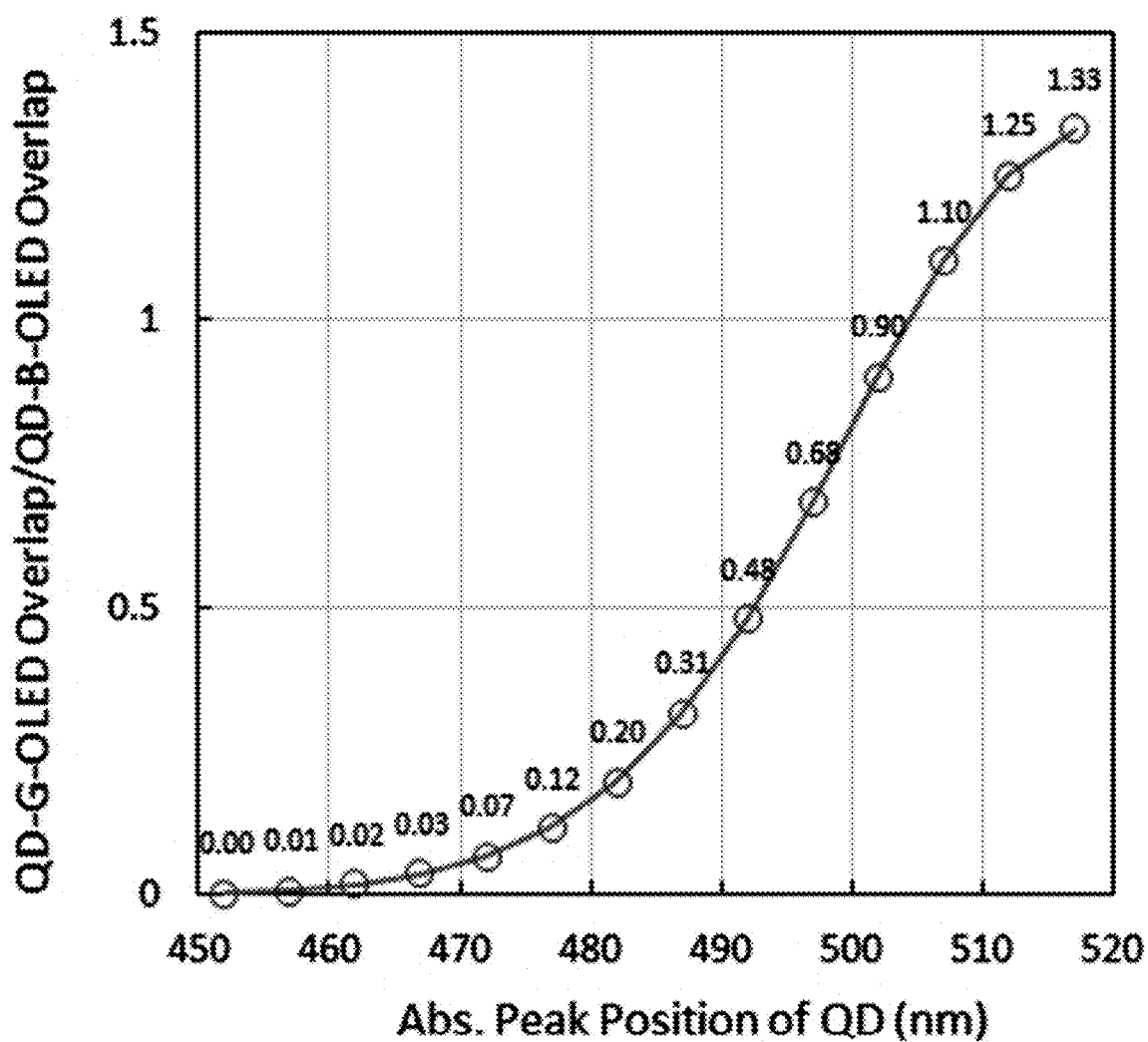
FIG. 7B shows a relationship of the spectral overlap ratio (B/A) versus a first absorption peak wavelength (Abs. Peak Position of QD, nm).

Considering UV-Vis absorption curves of the quantum dots according to Examples 1 to 2 and Comparative Examples 1 to 3, spectral overlaps (A, B) of an absorption curves of the luminescent nanostructures with each of a luminescent spectrum of the blue incident light (for a wavelength region of less than or equal to about 500 nm) and a luminescent spectrum of green incident light (for a wavelength region of greater than about 500 nm) are measured and based on the measured spectral overlap values, the relationship of the spectral overlap ratios (B/A) versus the absorption peak position (the $1^{st}$ absorption peak) of the luminescent nanostructures are determined, and the results are shown in FIGS. 7A and 7B.

Based on the results of FIGS. 7A and 7B, it is confirmed that the color conversion panels including the luminescent nanostructures of Examples 1 and 2 exhibit a spectral overlap of less than or equal to 0.6 by irradiation of mixed incident light.

Figure 8:
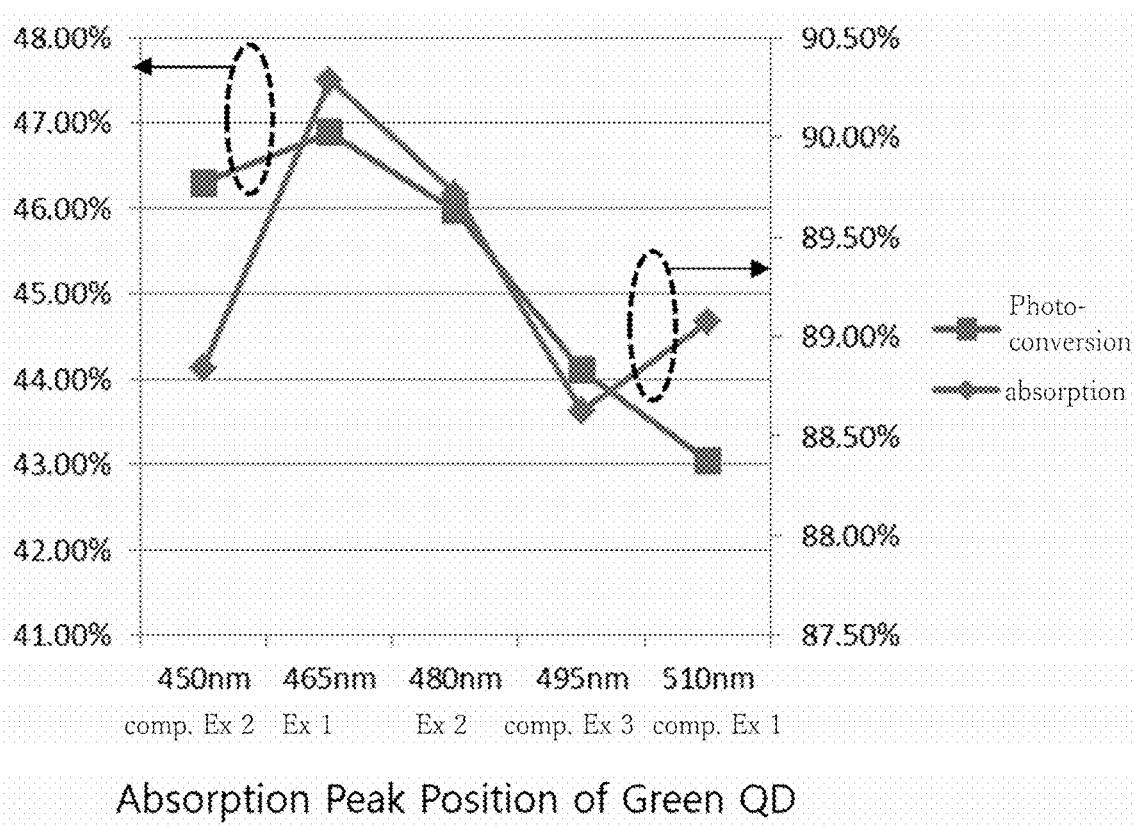
FIG. 8 shows the results of measuring light conversion rates and absorbances of the display panels of examples and comparative examples, respectively.

Referring to the results of FIG. 8, the color conversion panels including the quantum dot composite of the examples with the mixed incident light may exhibit improved optical properties, e.g., an incident light absorbance is greater than or equal to about 89%, and a light conversion rate is greater than or equal to about 45%, compared with that of the color conversion panels including the quantum dot composite of the comparative examples with the mixed incident light.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A display panel, comprising
a light emitting panel; and
a color conversion panel with a surface opposite a surface of the light emitting panel,
wherein the light emitting panel is configured to emit incident light comprising a first light with a maximum emission peak wavelength in a range of greater than or equal to about 450 nm and less than or equal to about 480 nm, and a second light with a maximum emission peak wavelength in a range of greater than or equal to about 500 nm and less than or equal to about 580 nm,
wherein the color conversion panel comprises a color conversion layer comprising a color conversion region, and optionally, a partition wall defining each region of the color conversion layer, the color conversion region comprises a first region corresponding to a green pixel,
the first region comprises a first composite comprising a matrix and a plurality of luminescent nanostructures dispersed within the matrix and comprising, and
the spectral overlap of a UV-Vis absorption spectrum of the luminescent nanostructures, the maximum emission peak of the first light, and the maximum emission peak of the second light satisfies the following equation:

$$B/A \leq about\ 0.6$$

wherein, A corresponds to an area where a UV-Vis absorption spectrum of the luminescent nanostructures overlaps with the maximum emission peak of the first light in a wavelength region of less than or equal to about 500 nm, and B corresponds to an area where the UV-Vis absorption spectrum of the luminescent nanostructures overlaps with the maximum emission peak of the second light in a wavelength region of greater than or equal to about 500 nm, and wherein for determination of the A, a height of a first absorption peak of the UV-Vis absorption spectrum of the luminescent nanostructures and a height of the maximum emission peak of the first light are adjusted to be equal, and for determination of the B, a height of a first absorption peak of the UV-Vis absorption spectrum of the luminescent nanostructures and a height of the maximum emission peak of the second light are adjusted to be equal.

2. The display panel of claim 1, wherein the light emitting panel comprises a first electrode and a second electrode, and a light emitting layer disposed between the first electrode and the second electrode.

3. The display panel of claim 2, wherein the light emitting layer comprises an organic compound and a dopant.

4. The display panel of claim 2, wherein the light emitting layer comprises a first light emitting layer and a second light emitting layer disposed on the first light emitting layer, wherein the first light emitting layer is configured to emit the first light and the second light emitting layer is configured to emit the second light.

5. The display panel of claim 4, wherein the light emitting layer further comprises a first charge generation layer disposed between the first light emitting layer and the second light emitting layer, and optionally, a charge auxiliary layer disposed between the first electrode and the first light emitting layer, between the second electrode and the second light emitting layer, or between the first electrode and the first light emitting layer and between the second electrode and the second light emitting layer.

6. The display panel of claim 1, wherein
the light emitting layer comprises a second light emitting layer disposed between two or more first light emitting layers, a first light emitting layer disposed between two or more second light emitting layers, or a combination thereof, and
wherein the first light emitting layer is configured to emit the first light, and the second light emitting layer configured to emit the second light.

7. The display panel of claim 1, wherein the incident light does not comprise red light having a wavelength of greater than or equal to about 600 nanometers and less than or equal to about 680 nanometers.

8. The display panel of claim 1, wherein
the maximum emission peak wavelength of the second light is in a range of greater than or equal to about 515 nanometers and less than or equal to about 530 nanometers, and
the maximum emission peak wavelength of the first light is in a range of greater than about 440 nanometers and less than or equal to about 465 nanometers.

9. The display panel of claim 1, wherein a maximum photoluminescence peak wavelength of the luminescent nanostructures is in the range of greater than or equal to about 520 nanometers and less than or equal to about 550 nanometers.

10. The display panel of claim 1, wherein a difference in the wavelength of the first absorption peak, and the wavelength of the maximum photoluminescence peak, of the luminescent nanostructures is greater than or equal to about 45 nanometers and less than or equal to about 65 nanometers.

11. The display panel of claim 1, wherein in the UV-Vis absorption spectrum of the luminescent nanostructures, an absorbance ratio of absorbance at a wavelength of about 450 nm with respect to absorbance at a wavelength of about 350 nm is greater than 0.078:1.

12. The display panel of claim 1, wherein the luminescent nanostructures exhibit a UV-Vis absorption spectrum having a positive differential coefficient value at about 450 nm.

13. The display panel of claim 1, wherein
the luminescent nanostructures comprise a first semiconductor nanocrystal comprising a Group III-V compound and a second semiconductor nanocrystal comprising zinc chalcogenide,
the Group III-V compound comprises indium and phosphorus,
the zinc chalcogenide comprises zinc, selenium, and sulfur, and
the luminescent nanostructures do not contain cadmium.

14. The display panel of claim 13, wherein
in the plurality of luminescent nanostructures, a mole ratio of sulfur to selenium is greater than about 2:1, or
in the plurality of luminescent nanostructures, a mole ratio of sulfur to indium is greater than or equal to about 7:1 and less than or equal to about 15:1, or
in the plurality of luminescent nanostructures, a mole ratio of selenium to indium is greater than or equal to about 2.5:1 and less than or equal to about 7:1.

15. The display panel of claim 1, wherein the luminescent nanostructures have an average size of less than or equal to about 6 nanometers when confirmed by electron microscopy analysis.

16. The display panel of claim 1, wherein in the spectral overlap, the B/A is less than or equal to about 0.5.

17. The display panel of claim 1, wherein the first composite or the color conversion panel has an incident light absorbance defined by the following equation of greater than or equal to about 89%:

$$incident\ light\ absorbance\ (\%) = [(B-B')/BG] \times 100(\%)$$

B: light dose of incident light of having a wavelength of less than or equal to about 500 nm, and
B': light dose of incident light having a wavelength of less than or equal to about 500 nm that has passed through the first composite.

18. The display panel of claim 1, wherein the first composite or the color conversion panel has a light conversion rate defined by the following equation of greater than or equal to about 45%:

$$A/B\ (\%) = light\ conversion\ rate$$

A: light dose of green light having a wavelength of greater than or equal to about 500 nm and being emitted from the first composite, and
B: light dose of incident light having a wavelength of less than or equal to about 500 nm.

19. The display panel of claim 1, wherein the color conversion region further comprises a second region corresponding to a red pixel, a third region corresponding to a blue pixel, or a combination thereof.

20. An electronic device comprising the display panel of claim 1.

* * * * *